(12) United States Patent
Vimercati

(10) Patent No.: US 11,393,822 B1
(45) Date of Patent: Jul. 19, 2022

(54) THIN FILM TRANSISTOR DECK SELECTION IN A MEMORY DEVICE

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/327,035

(22) Filed: May 21, 2021

(51) Int. Cl.

| G11C 8/00 | (2006.01) |
|---|---|
| H01L 27/108 | (2006.01) |
| H01L 27/06 | (2006.01) |
| H01L 27/11514 | (2017.01) |
| G11C 11/408 | (2006.01) |
| G11C 11/22 | (2006.01) |
| H01L 29/786 | (2006.01) |

(52) U.S. Cl.
CPC ...... H01L 27/10805 (2013.01); G11C 11/221 (2013.01); G11C 11/2253 (2013.01); G11C 11/408 (2013.01); H01L 27/0688 (2013.01); H01L 27/11514 (2013.01); H01L 29/78642 (2013.01)

(58) Field of Classification Search
CPC .......... H01L 27/10805; H01L 27/0688; H01L 27/11514; H01L 29/78642; G11C 11/221; G11C 11/2253; G11C 11/408
USPC .................................................. 365/149, 63
See application file for complete search history.

(56) References Cited

U.S. PATENT DOCUMENTS

| 9,792,958 B1* | 10/2017 | Laurent .............. G11C 11/2253 |
| 2007/0170520 A1* | 7/2007 | Zhang ............... H01L 27/11521 257/390 |
| 2009/0201710 A1* | 8/2009 | Ueda .................. G11C 13/0004 365/51 |
| 2009/0204797 A1* | 8/2009 | Bonanno ............... G06F 9/3806 712/239 |
| 2010/0321988 A1* | 12/2010 | Wells ...................... G11C 11/16 365/163 |
| 2018/0331114 A1* | 11/2018 | Vimercati ............. G11C 11/221 |
| 2019/0043595 A1* | 2/2019 | Vimercati ............. G11C 11/221 |

(Continued)

FOREIGN PATENT DOCUMENTS

| JP | 2019102811 A * | 6/2019 | ........... H01L 27/108 |
| KR | 20210032225 A * | 3/2021 | ........... G11C 13/003 |

*Primary Examiner* — Viet Q Nguyen

(74) *Attorney, Agent, or Firm* — Holland & Hart LLP

(57) ABSTRACT

Methods, systems, and devices for thin film transistor deck selection in a memory device are described. A memory device may include memory arrays arranged in a stack of decks formed over a substrate, and deck selection components distributed among the layers to leverage common substrate-based circuitry. For example, each memory array of the stack may include a set of digit lines of a corresponding deck, and deck selection circuitry operable to couple the set of digit lines with a column decoder that is shared among multiple decks. To access memory cells of a selected memory array on one deck, the deck selection circuitry corresponding to the memory array may each be activated, while the deck selection circuitry corresponding to a non-selected memory array on another deck may be deactivated. The deck selection circuitry, such as transistors, may leverage thin-film manufacturing techniques, such as various techniques for forming vertical transistors.

20 Claims, 9 Drawing Sheets

(56) References Cited

U.S. PATENT DOCUMENTS

| | | | |
|---|---|---|---|
| 2019/0067206 A1* | 2/2019 | Bedeschi | H01L 23/528 |
| 2019/0172502 A1* | 6/2019 | Jeong | G11C 13/0028 |
| 2019/0326357 A1* | 10/2019 | Castro | H01L 27/249 |
| 2020/0098414 A1* | 3/2020 | Vimercati | G11C 11/2259 |
| 2020/0176420 A1* | 6/2020 | Or-Bach | H01L 23/473 |
| 2020/0194431 A1* | 6/2020 | Castro | H01L 45/085 |

* cited by examiner

THIN FILM TRANSISTOR DECK SELECTION IN A MEMORY DEVICE

FIELD OF TECHNOLOGY

The following relates to memory devices, including thin film transistor deck selection in a memory device.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
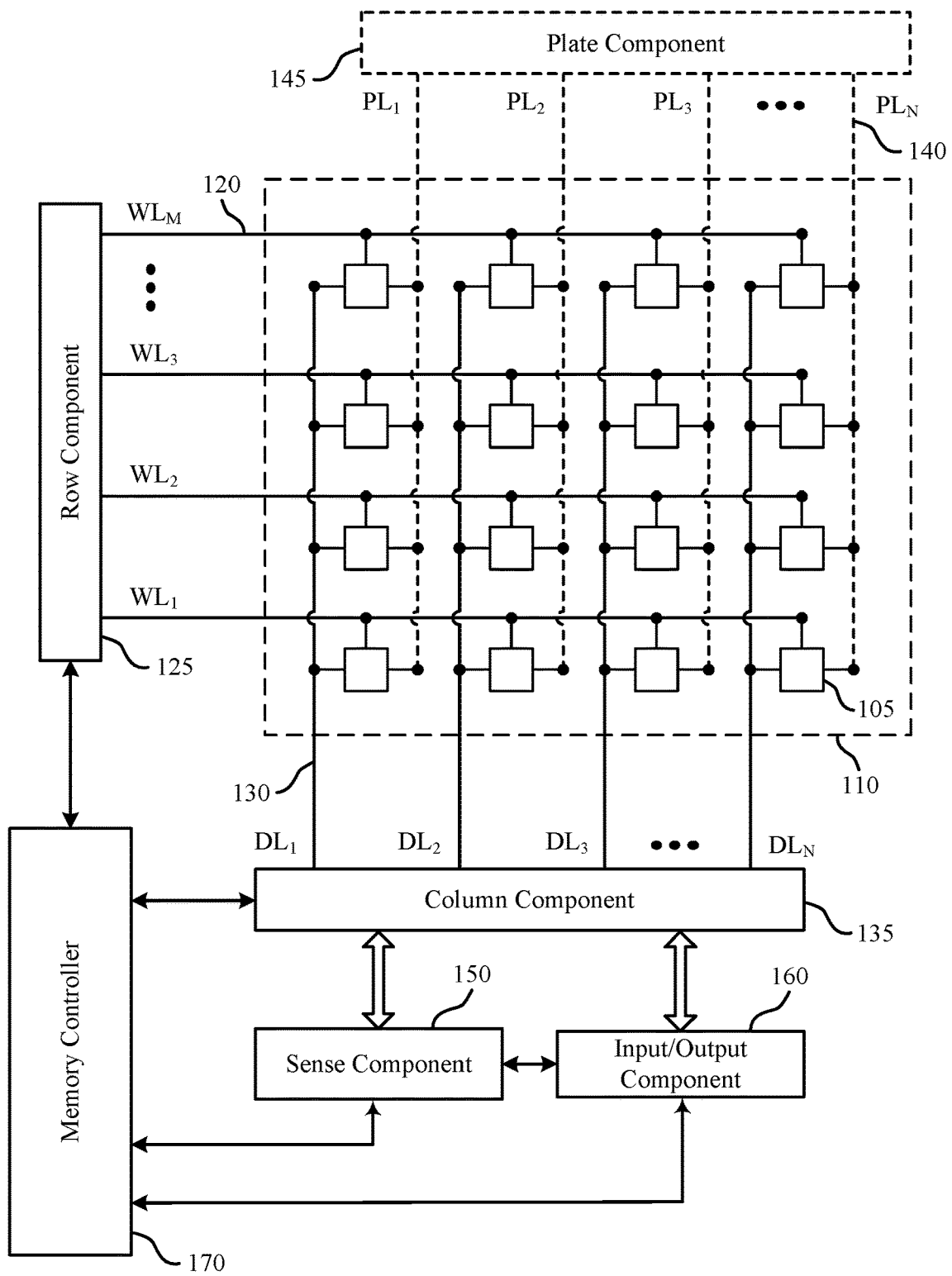
FIG. 1 illustrates an example of a memory device that supports thin film transistor deck selection in accordance with examples as disclosed herein.

Memory devices may include various arrangements of memory arrays formed over a substrate, where memory cells of the memory arrays may be organized or addressed in accordance with rows and columns. In some examples, circuitry that supports accessing or operating the memory arrays may be located below the memory arrays, which may refer to a location that is at least in part between the memory arrays and the substrate. For example, row decoders or column decoders, among other types of decoding circuitry, may be located below the memory arrays but above the substrate and, in some examples, may include transistors that are formed at least in part by doping portions of the substrate (e.g., substrate-based transistors, transistors having channels formed from doped crystalline silicon or other semiconductor). As memory devices scale with a greater quantity of layers or decks above a substrate, the area of a substrate used for such decoders or other supporting circuitry may increase, which may lead to various scaling limitations (e.g., related to the limited area of a substrate to support a growing quantity of decks and, by extension, a growing quantity and area for such decoders or other supporting circuitry).

In accordance with examples as disclosed herein, a memory device may include memory arrays arranged in a stack of decks formed over a substrate, and deck selection components (e.g., deck selection transistors, deck decoding or addressing circuitry) may be distributed among the layers to leverage common substrate-based circuitry. For example, each memory array of the stack may include a set of digit lines of a corresponding deck, and deck selection circuitry, such as deck selection transistors or other switching circuitry (e.g., of the corresponding deck, of another deck) operable to couple the set of digit lines with a column decoder that may be shared among (e.g., coupled with) multiple decks. To access memory cells of a selected memory array on one deck, the deck selection circuitry corresponding to the selected memory array may each be activated (e.g., coupling digit lines of the selected memory array with the common column decoder), while the deck selection circuitry corresponding to a non-selected memory array on another deck may be deactivated (e.g., isolating digit lines of the non-selected memory array from the common column decoder). Deck selection circuitry, such as deck selection transistors, may leverage thin-film manufacturing techniques, such as various techniques for forming vertical transistors (e.g., transistors having vertical channels, transistors having channels oriented at least in part along a thickness direction of the memory die, transistors having polycrystalline silicon channels) above a substrate. Implementing deck selection circuitry at various decks of such a memory die may alleviate or mitigate area utilization challenges of a substrate level, such as moving certain aspects of decoding or addressing into decks or levels above the substrate, which may improve scaling in memory devices by supporting a greater quantity of decks for a given area of substrate-based circuitry.

Features of the disclosure are initially described in the context of a memory device and related circuitry as described with reference to FIGS. 1 through 3. Features of the disclosure are described in the context of memory die layouts with reference to FIGS. 4 through 7. These and other features of the disclosure are further illustrated by and described with reference to flowcharts that relate to methods of formation and operation of memory devices that support thin film transistor deck selection with references to FIGS. 8 and 9.

FIG. 1 illustrates an example of a memory device 100 that supports thin film transistor deck selection in accordance with examples as disclosed herein. The memory device 100 may also be referred to as a memory die, or an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, or capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130, which may be referred to as activating the one or more memory cells 105 or coupling the one or more memory cells 105 with a respective one or more digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer, a common plate node).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate a corresponding word line 120 based on the received row address. Similarly, a column component 135 may receive a column address from the memory controller 170 and activate a corresponding digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set or subset of digit lines 130 connected to the sense component 150. For example, a sense component 150 may include a separate sensing circuit (e.g., a separate or duplicated sense amplifier, a separate or duplicated signal development component) for each of a set or subset of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. A row component 125, a column component 135, or a plate component 145 may accept data, for example, via input/output component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude sufficient to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, the memory device 100 may include multiple memory arrays 110 arranged in a stack of decks or levels relative to a substrate of the memory device 100 (e.g., a semiconductor substrate, a crystalline silicon substrate, a crystalline semiconductor substrate, a portion of a semiconductor wafer). Circuitry that supports accessing or operating the multiple memory arrays 110 may be located below the memory arrays 110, which may refer to a location that is at least in part between the memory arrays 110 and the substrate. For example, one or more row components 125, one or more column components 135, one or more plate components 145, one or more sense components 150, or one or more input/output components 160, or any combination thereof may be located below the memory arrays 110 but above the substrate and, in some examples, may include transistors that are formed at least in part by doping portions of the substrate (e.g., substrate-based transistors, transistors having channels formed from doped crystalline silicon or other semiconductor). When scaling the memory device 100 with a greater quantity of decks or levels of memory arrays 110, the area of a substrate used for the supporting circuitry may increase, which may lead to scaling limitations (e.g., related to the limited area of a substrate to support circuitry for accessing a growing quantity of decks or levels of memory arrays 110 and, by extension, a growing quantity and area for such decoders or other supporting circuitry), among other challenges.

In accordance with examples as disclosed herein, the memory device 100 may include memory arrays 110 arranged in a stack of decks formed over a substrate, and deck selection components (e.g., deck selection transistors, deck decoding or addressing circuitry) distributed among the decks to leverage common substrate-based circuitry. For example, each memory array 110 of the stack may include a set of digit lines 130 of a corresponding deck, and deck selection circuitry, such as transistors (e.g., of the corresponding deck, of another deck), operable to couple the set of digit lines 130 with a column decoder that is shared (e.g., coupled with, used for accessing or multiplexing) among multiple decks. To access memory cells 105 of a selected memory array 110 on one deck, deck selection circuitry (e.g., transistors or other switching components) corresponding to the selected memory array 110 may each be activated (e.g., coupling digit lines 130 of the selected memory array with the common column decoder), and the deck selection circuitry corresponding to a non-selected memory array 110 on another deck may be deactivated (e.g., isolating digit lines 130 of the non-selected memory array from the common column decoder). In some examples, deck selection transistors may include thin-film transistors that leverage thin-film manufacturing techniques, such as various techniques for forming vertical transistors (e.g., transistors having vertical channels, transistors having channels oriented at least in part along a thickness direction relative to a substrate, transistors having channel portions formed at least in part by polycrystalline silicon). Implementing deck selection circuitry at various decks of such a memory device 100 may alleviate or mitigate area utilization challenges of a substrate level, such as moving certain aspects of decoding or addressing into decks or levels above the substrate, which may improve scaling in memory devices by supporting a greater quantity of decks for a given area of substrate-based circuitry.

Figure 2:
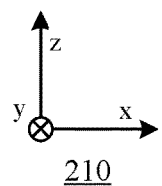
FIG. 2 illustrates an example of a transistor structure that supports thin film transistor deck selection in a memory device in accordance with examples as disclosed herein.
Figure 2:
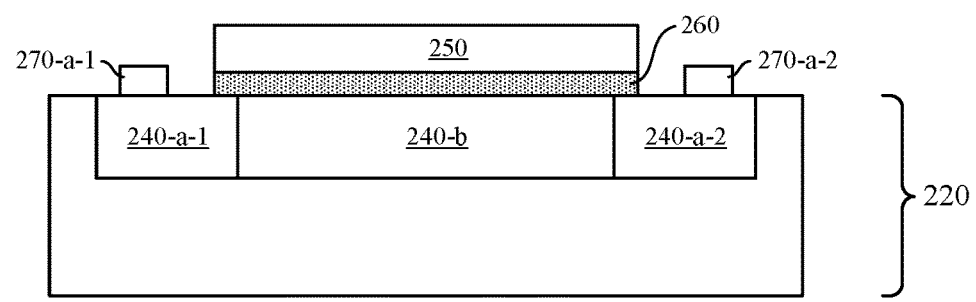

FIG. 2 illustrates an example of a transistor structure 200 that supports thin film transistor deck selection in a memory device in accordance with examples as disclosed herein. The transistor structure 200 illustrates an example of a transistor that is formed at least in part by portions of a substrate 220 (e.g., doped portions 240 of the substrate 220), and may illustrate an arrangement of features for a transistor that is configured in a planar transistor arrangement. The substrate 220 may be a portion of a semiconductor chip, such as a silicon chip of a memory die (e.g., crystalline silicon, monocrystalline silicon). For illustrative purposes, aspects of the transistor structure 200 may be described with reference to an x-direction, a y-direction, and a z-direction (e.g., a height direction) of a coordinate system 210. In some examples, the z-direction may be illustrative of a direction perpendicular to a surface of the substrate 220 (e.g., a surface in an xy-plane, a surface upon or over which other materials may be deposited), and each of the structures, illustrated by their respective cross section in an xz-plane, may extend for some distance (e.g., length) along the y-direction.

The transistor structure 200 illustrates an example of a transistor channel, electrically coupled between a terminal 270-a-1 and a terminal 270-a-2, that may include one or more doped portions 240 of the substrate 220. In various examples, one of the terminals 270-a-1 or 270-a-2 may be referred to as a source terminal, and the other of the terminals 270-a-1 or 270-a-2 may be referred to as a drain terminal, where such designation or nomenclature may be based on a configuration or relative biasing of a circuit that includes the transistor structure 200. The channel or channel portion of a transistor may include or refer to one or more portions of the transistor structure that are operable to open or close a conductive path (e.g., to modulate a conductivity, to form a channel, to open a channel, to close a channel) between a source and drain (e.g., between the terminal 270-a-1 and the terminal 270-a-2) based at least in part on a voltage of a gate (e.g., a gate terminal, a gate portion 250). In other words, a channel portion of a transistor structure may be configured to be activated, deactivated, made conductive, or made non-conductive, based at least in part on a voltage of a gate portion, such as gate portion 250. In some examples of transistor structure 200 (e.g., a planar transistor arrangement), the channel portion formed by one or more doped portions 240 of the substrate 220 may support a conductive path in a generally horizontal or in-plane direction (e.g., along the x-direction, within an xy-plane, in a direction within or parallel to a surface of the substrate 220).

In some examples, the gate portion 250 may be physically separated from the channel portion (e.g., separated from the substrate 220, separated from one or more of the doped portions 240) by a gate insulation portion 260 (e.g., a gate dielectric). Each of the terminals 270 may be in contact with or otherwise coupled with (e.g., electrically, physically) a respective doped portion 240-a, and each of the terminals 270 and the gate portion 250 may be formed from an electrically conductive material such as a metal or metal alloy, or a polycrystalline semiconductor (e.g., polysilicon).

In some examples, the transistor structure 200 may be operable as an n-type or n-channel transistor, where applying a relatively positive voltage to the gate portion 250 that is above a threshold voltage (e.g., an applied voltage having a positive magnitude, relative to a source terminal, that is greater than a threshold voltage) activates the channel portion or otherwise enables a conductive path between the terminals 270-a-1 and 270-a-2 (e.g., along a direction generally aligned with the x-direction within the substrate 220). In such examples, the doped portions 240-a may refer to portions having n-type doping or n-type semiconductor, and doped portion 240-b may refer to portions having p-type doping or p-type semiconductor (e.g., a channel portion having an NPN configuration along the x-direction or channel direction).

In some examples, the transistor structure 200 may be operable as a p-type or p-channel transistor, where applying a relatively negative voltage to the gate portion 250 that is above a threshold voltage (e.g., an applied voltage having a negative magnitude, relative to a source terminal, that is greater than a threshold voltage) activates the channel portion or otherwise enables a conductive path between the terminals 270-a-1 and 270-a-2. In such examples, the doped portions 240-a may refer to portions having p-type doping or p-type semiconductor, and doped portion 240-b may refer to portions having n-type doping or n-type semiconductor (e.g., a channel portion having a PNP configuration along the x-direction or channel direction).

In some examples, circuitry operable to support access operations on memory cells 105 (e.g., a row component 125, a column component 135, a plate component 145, a sense component 150, a memory controller 170, or various combinations thereof) may be formed from respective sets of transistors each having the arrangement of the transistor structure 200, where each of the transistors may have a channel portion formed by respective doped portions 240 of a substrate 220. In some examples, such transistors may leverage a crystalline semiconductor material of the substrate 220 for various performance characteristics or manufacturing characteristics of such a material or an arrangement. Some examples of such an arrangement may be implemented in a complementary metal-oxide-semiconductor (CMOS) configuration, which may refer to various examples of a complementary and symmetrical pair of a p-type transistor and an n-type transistor (e.g., for logic functions). However, such structures or arrangements of substrate-based transistors may be limited by an available area of the substrate 220 (e.g., under a memory array 110 or stack of levels or decks of memory arrays 110).

In accordance with examples as disclosed herein, various aspects of a column component 135 may be alternatively located away from (e.g., above) a substrate 220, including distributing various components or circuitry to levels or decks of a stack of memory arrays 110. For example, certain circuitry, such as transistors, that support aspects of decoding or addressing associated with the column component 135 may be formed in one or more layers or levels above a substrate 220, where such transistors may include or be referred to as thin film transistors, or vertical transistors, among other configurations or terminology.

Figure 3:
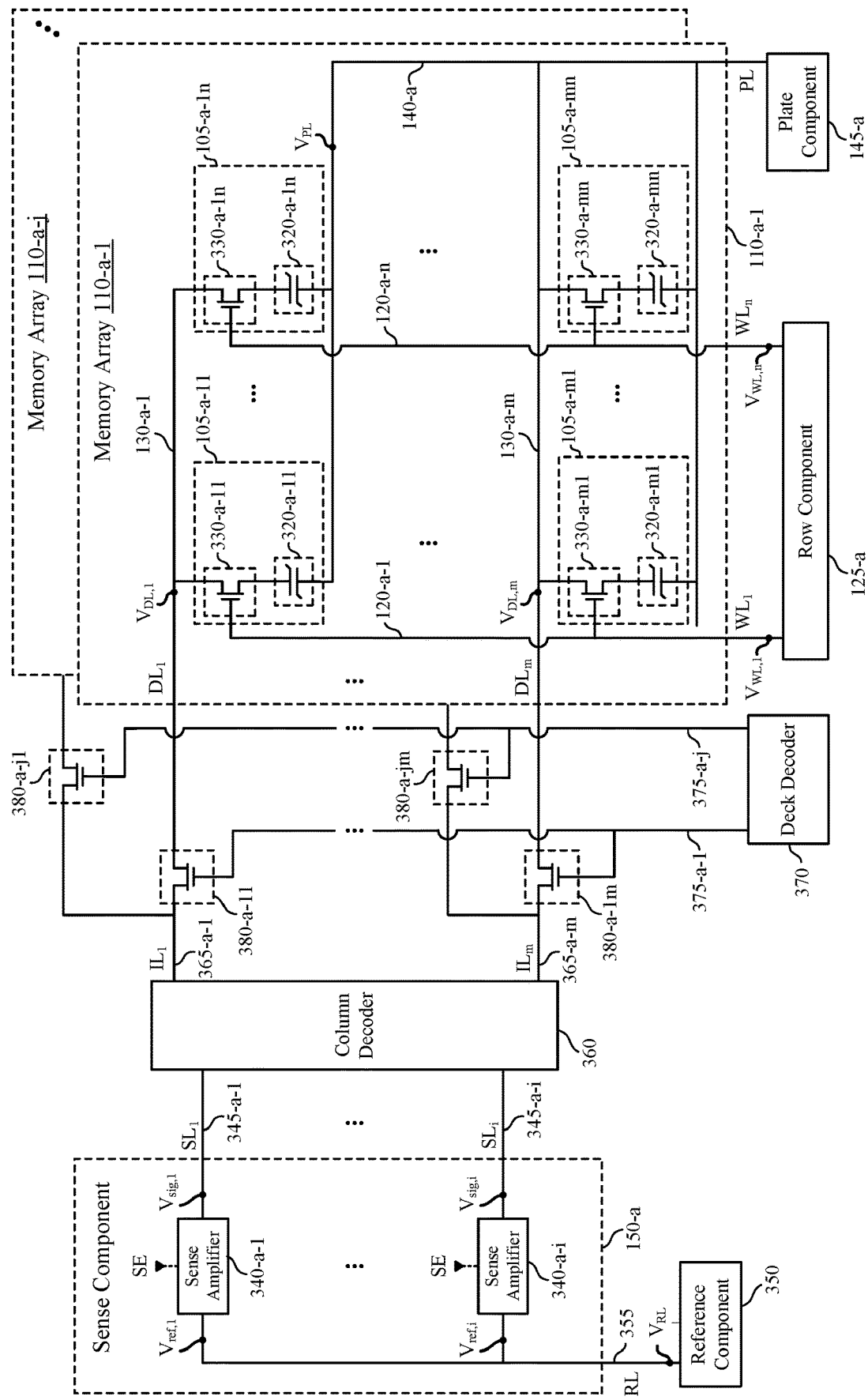
FIG. 3 illustrates an example of a circuit that supports thin film transistor deck selection in a memory device in accordance with examples as disclosed herein.

FIG. 3 illustrates an example of a circuit 300 that supports thin film transistor deck selection in a memory device in accordance with examples as disclosed herein. The circuit 300 may include a plurality of j memory arrays 110-a (e.g., memory arrays 110-a-1 through 110-a-j), each of which may be associated with a deck (e.g., a level, a vertical position, a height) above a substrate of a memory die (e.g., a substrate 220). For the sake of illustrative clarity, components of a memory array 110-a are described with reference to a first memory array 110-a-1, but each of the memory arrays 110-a-1 through 110-a-j of the circuit 300 may be associated with respective components or functionality, that is similar, different, or some combination thereof.

The first memory array 110-a-1 may include a set of memory cells 105-a (e.g., memory cells 105-a-11 through 105-a-mn, a set of memory cells 105 associated with the first memory array 110-a-1), which may be arranged according to m columns and n rows. In the example of circuit 300, each of the memory cells 105-a includes a respective capacitor 320-a and a respective cell selection component 330-a (e.g., a cell selection transistor). In some examples, one or more of the capacitors 320-a may be ferroelectric capacitors operable to store a charge or polarization corresponding to a logic state (e.g., for ferroelectric memory cells 105-a, according to a ferroelectric memory architecture). A ferroelectric material used in a ferroelectric capacitor 320 may be characterized by an electric polarization where the material maintains a non-zero electric charge in the absence of an electric field. Electric polarization within a ferroelectric capacitor 320 results in a net charge at the surface of the ferroelectric material, and attracts opposite charge through the terminals of the ferroelectric capacitor 320. Thus, charge may be stored at the interface of the ferroelectric material and the capacitor terminals. In some examples, memory cells 105-a may include storage elements of different memory architectures, such as linear capacitors (e.g., in a DRAM application), transistors (e.g., in a NAND application, in an SRAM application), or material memory elements (e.g., chalcogenide storage elements, resistive storage elements, thresholding storage elements), among other types of storage elements.

Each of the memory cells 105-a may be coupled with a word line 120 (e.g., one of word lines 120-a-1 through 120-a-n), a digit line 130 (e.g., one of digit lines 130-a-1 through 130-a-m), and a plate line 140-a. In some illustrative examples, memory cells 105-a-11 through 105-a-1n may represent a set or column of memory cells 105 coupled with or between a digit line 130 (e.g., digit line 130-a-1) and the plate line 140-a. In some illustrative examples, memory cells 105-a-11 through 105-a-m1 may represent a set or row of memory cells 105 coupled with a word line 120 (e.g., word line 120-a-1). Although the memory array 110-a-1 is illustrated as including a common plate line 140-a for all of the memory cells 105-a, some examples of a circuit 300 may include a separate plate lines 140 for each row of memory cells 105-a (e.g., an independently accessible plate line 140 associated with each of the word lines 120-a) or separate plate lines 140 for each column of memory cells 105-a (e.g., an independently accessible plate line 140 associated with each of the digit lines 130-a), among other configurations.

Each of the word lines 120-a (e.g., each of the word lines $WL_1$ through $WL_n$) may be associated with a respective word line voltage $V_{WL}$ as illustrated, and may be coupled with a row component 125-a (e.g., a row decoder). The row component 125-a may couple one or more of the word lines 120-a with various voltage sources (not shown). In some illustrative examples, the row component 125-a may selectively couple one or more of the word lines 120-a with a voltage source having a relatively high voltage (e.g., a selection voltage, which may be a voltage greater than 0V) or a voltage source having a relatively low voltage (e.g., a deselection voltage, which may be a ground voltage of 0V, or a negative voltage). Each of the digit lines 130-a (e.g., each of the digit lines $DL_1$ through $DL_m$) may be associated with a respective digit line voltage $V_{DL}$ as illustrated, and a memory cell 105-a, or capacitor 320-a or other storage element thereof, may be coupled with a digit line 130-a based at least in part on an activation or activation voltage of an associated word line 120-a.

In some examples, the row component 125-a may be shared among (e.g., coupled with, used for decoding, addressing, or accessing) the memory arrays 110-a-1 through 110-a-j, and an activation of a word line 120-a of the memory array 110-a-1 may be accompanied by a corresponding activation of a word line 120 of one or more of the other memory arrays 110-a (e.g., activating a row in each of the memory arrays 110-a-1 through 110-a-j, activating a row in a subset of the memory arrays 110-a-1 through 110-a-j). For example, each output terminal or node of the row component 125-a may be coupled with a respective word line 120 of each of the memory arrays 110-a-1 through 110-a-a-j, or some subset thereof, which may include interconnections (e.g., vias, sockets, through-silicon vias (TSVs)) through the decks or levels of the memory device 100 or memory die that includes the circuit 300 to interconnect word lines 120 of the different decks or levels (e.g., of different ones of the memory arrays 110-a).

The plate line 140-a (e.g., plate line PL) may be associated with a plate line voltage $V_{PL}$ as illustrated, and may be coupled with a plate component 145-a (e.g., a plate decoder). The plate component 145-a may couple the plate line 140-a with various voltage sources (not shown). In one example, the plate component 145-a may selectively couple the plate line 140-a with a voltage source having a relatively high voltage (e.g., a plate high voltage, which may be a voltage greater than 0V) or a voltage source having a relatively low voltage (e.g., a plate low voltage, which may be a ground voltage of 0V, or a negative voltage).

In some examples, the plate component 145-a may be shared among (e.g., coupled with, used for decoding, addressing, or accessing) the memory arrays 110-a-1 through 110-a-j, and an activation of the plate line 140-a of the memory array 110-a-1 may be accompanied by a corresponding activation of a plate line 140 of one or more of the other memory arrays 110-a (e.g., activating a common plate in each of the memory arrays 110-a-1 through 110-a-j, activating a common plate in a subset of the memory arrays 110-a-1 through 110-a-j). For example, each output terminal or node of the plate component 145-a may be coupled with a respective plate line 140 of each of the memory arrays 110-a-1 through 110-a-j, or some subset thereof, which may include interconnections (e.g., vias, sockets, TSVs) through the decks or levels of the memory device 100 or memory die that includes the circuit 300 to interconnect plate lines 140 of the different decks or levels. In some examples, one or more plate lines 140 of each of the memory arrays 110-a may be independently addressable, or may be otherwise biased independently from one another by the plate component 145-a.

The sense component 150-a may include various components for accessing (e.g., reading, writing) the memory cells 105 of the memory arrays 110-*a*-1 through 110-*a*-*j*. For example, the sense component 150-*a* may include a set of i sense amplifiers 340-*a* (e.g., sense amplifiers 340-*a*-1 through 340-*a*-1) each coupled between a respective signal line 345-*a* and a reference line 355. Each sense amplifier 340-*a* may include various transistors or amplifiers to detect, convert, or amplify a difference in signals, which may be referred to as latching. For example, a sense amplifier 340-*a* may include circuit elements that receive and compare a sense signal voltage (e.g., $V_{sig}$) of a respective signal line 345-*a* with a reference signal voltage (e.g., $V_{ref}$) of the reference line 355, which may be provided by a reference component 350. An output of a sense amplifier 340 may be driven to a higher (e.g., a positive) or a lower voltage (e.g., a negative voltage, a ground voltage) based on the comparison at the sense amplifier 390.

In some examples, electrical signals associated with such latching may be communicated between the sense component 150-*a* (e.g., sense amplifiers 340-*a*) and an input/output component 160, for example, via I/O lines 195 (not shown). In some examples, the sense component 150-*a* may be in electronic communication with a memory controller (not shown), such as a memory controller 170 described with reference to FIG. 1, which may control various operations of the sense component 150-*a*. In some examples, activating a logical signal SE may be referred to as "enabling" or "activating" the sense component 150-*a* or sense amplifiers 340-*a* thereof. In some examples, activating logical signal SE may be referred to, or be part of an operation known as "latching" the result of accessing memory cells 105.

The circuit 300 may implement various techniques for multiplexing the digit lines 130 with the sense amplifiers 340-*a* to support accessing the memory cells 105-*a*. For example, a quantity of sense amplifiers 340-*a* of the sense component 150-*a* may be less than a quantity of digit lines 130 among the memory arrays 110-*a*-1 through 110-*a*-*j*, and certain ones of the digit lines 130 of the memory arrays 110-*a*-1 through 110-*a*-*j* may be coupled with certain ones of the sense amplifiers 340-*a* over a given duration for a performing an access operation. In accordance with examples as disclosed herein, the circuit 300 may support such multiplexing using a combination of a column decoder 360 and a deck decoder 370, which may refer to a distribution or separation of components or functionality of a column component 135 described with reference to FIG. 1.

The column decoder 360 may be configured to support multiplexing or coupling between the i sense amplifiers 340-*a* or i signal lines 345-*a* (e.g., signal lines 345-*a*-1 through 345-*a*-*i*, $SL_1$ through $SL_i$) and m intermediate lines 365 (e.g., intermediate lines 365-*a*-1 through 365-*a*-*m*, $IL_1$ through $IL_m$). In some examples, m may be greater than i, such as m being an integer multiple of i. In some examples, m may be equal to a quantity of digit lines 130 or columns in each of the memory arrays 110-*a*-1 through 110-*a*-*j*.

The deck decoder 370 may be operable to select from among the memory arrays 110-*a*, which may include a selective coupling or isolation via respective transistors 380-*a* (e.g., deck selection transistors) between intermediate lines 365-*a* and digit lines 130-*a* of one or more selected memory arrays 110-*a*. In the example of circuit 300, each memory array 110-*a* may be associated with a respective row of transistors 380-*a*, which may be activated using a respective deck selection line 375. For example, memory array 110-*a*-1 may be associated with transistors 380-*a*-11 through 380-*a*-1*m* and a deck selection line 375-*a*-1, memory array 110-*a*-*j* may be associated with transistors 380-*a*-*j*1 through 380-*a*-*jm* and a deck selection line 375-*a*-*j*, and so on. In some examples, a quantity of memory arrays 110-*a* and deck selection lines 375-*a* (e.g., a quantity j) may be equal to a quantity of decks or levels of the circuit 300 (e.g., of a memory device 100 or a memory die that includes the circuit 300). In some examples (e.g., when multiple memory arrays 110-*a* are located on a same deck or level), a quantity of memory arrays 110-*a* and deck selection lines 375-*a* may be greater than a quantity of decks or levels (e.g., an integer multiple of decks or levels).

In some examples, when an access operation is to be performed on memory cells 105-*a* of the memory array 110-*a*-1, the deck decoder 370 may activate the deck selection line 375-*a*-1. Activating the deck selection line 375-*a*-1 may activate each of the transistors 380-*a*-11 through 380-*a*-1*m*, thereby coupling the digit lines 130-*a*-1 through 130-*a*-*m* with the column decoder 360 (e.g., via intermediate lines 365-*a*-1 through 365-*a*-*m*). The column decoder 360 may be accordingly operable for coupling one or more of the digit lines 130-*a*-1 through 130-*a*-*m* of the selected memory array 110-*a*-1 with the sense amplifiers 340-*a*-1 through 340-*a*-*i* to support various access operations (e.g., read operations, write operations).

In some examples, when an access operation is to be performed on memory cells 105-*a* of the memory array 110-*a*-1, the deck decoder 370 may deactivate other deck selection lines 375 (e.g., deck selection line 375-*a*-*j*, among others), which may deactivate each of the other transistors 380 (e.g., transistors 380-*a*-*j*1 through 380-*a*-*jm*, among others), thereby decoupling the digit lines 130 of the other memory arrays 110-*a* from the column decoder 360 (e.g., from intermediate lines 365-*a*-1 through 365-*a*-*m*). In some examples, such an isolation may improve read margins, power consumption, or other operation of the circuit 300, due to reduced intrinsic capacitance from the perspective of the sense amplifiers 340-*a*, or reduced charge leakage or dissipation (e.g., via unselected memory arrays 110-*a*), among other phenomena. Moreover, such isolation may support simplified row decoding (e.g., when word lines 120 of different memory arrays 110-*a* are coupled with a same or common output of the row component 125-*a*), since rows of multiple memory arrays 110-*a* may be activated while only the digit lines 130 of certain selected memory arrays 110-*a* may be coupled with circuitry supporting a given access operation.

The configuration of components in the circuit 300 may also support improved flexibility for layout or formation of a memory device 100 or memory die that includes the circuit 300. For example, the row component 125-*a*, the plate component 145-*a*, the sense component 150-*a*, the reference component 350, or the column decoder 360, or various combinations thereof, may be formed at least in part by circuitry that is below the memory arrays 110-*a*, or at least on another deck or level than the memory arrays 110-*a*. In some examples, such circuitry may be formed at least in part on a substrate (e.g., a substrate 220, a crystalline semiconductor portion), and may include various configurations of substrate-based transistors (e.g., in accordance with the transistor structure 200, including one or more sets of transistors in a CMOS configuration). However, in some examples, the area of such circuitry may be greater than an area of each of the memory arrays 110-*a*, which may limit scaling of the circuit 300 on a memory die, or result in relatively inefficient substrate utilization.

In accordance with examples as disclosed herein, the transistors 380 may be located above a substrate, including various locations among the decks or levels of the memory arrays 110-*a* (e.g., distributed among one or more decks or levels of a plurality of decks or levels above the substrate). For example, the transistors 380 may be formed using thin film fabrication techniques, such as including respective channel portions formed from polycrystalline semiconductor material (e.g., deposited over a substrate 220). In some examples, the transistors 380 may be formed as vertical transistors (e.g., transistors having a channel portion that is aligned in a height direction relative to a substrate 220), including various configurations that leverage one or more pillars of channel material having a conductivity that may be modulated based on a voltage of a respective gate portion. By moving the transistors 380 above a substrate, the circuit 300 may support improved flexibility for distributing decoding circuitry throughout a memory die, which may improve area utilization, or semiconductor material utilization, among other benefits.

Figure 4:
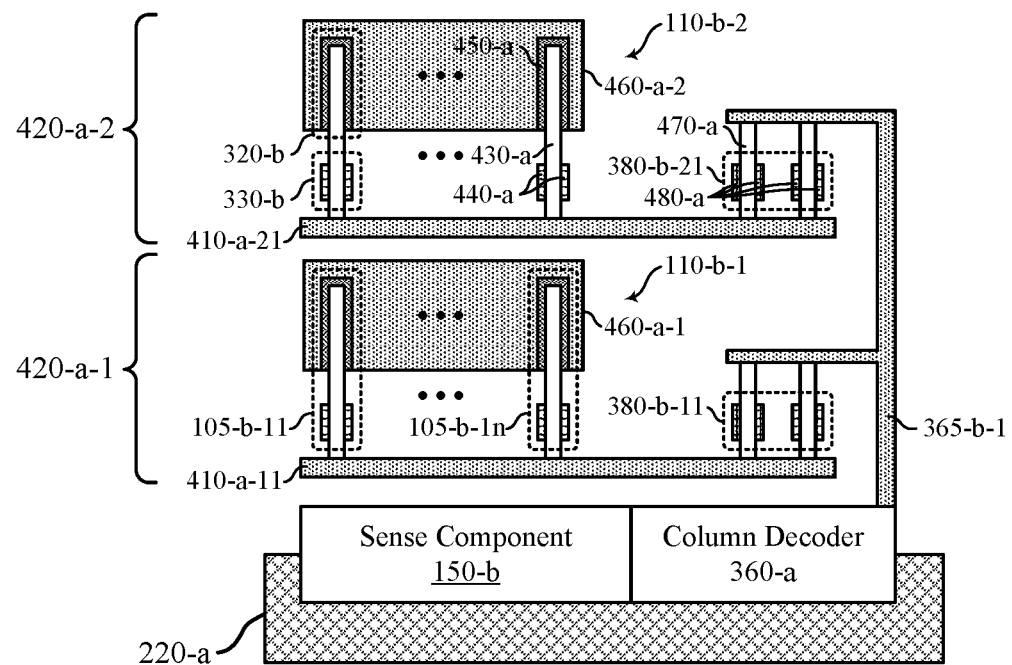
FIGS. 4 through 7 illustrate example layouts of memory dies that support thin film transistor deck selection in a memory device in accordance with examples as disclosed herein.

FIG. 4 illustrates an example of a memory structure 400 that supports thin film transistor deck selection in a memory device in accordance with examples as disclosed herein. The memory structure 400 may be illustrative of portions of a memory device 100 or memory die that may be formed with or over a substrate 220-a, which may be an example of a substrate 220 described with reference to FIG. 2. The memory structure 400 may illustrate examples for implementing aspects of the circuit 300 described with reference to FIG. 3. For illustrative purposes, aspects of the memory structure 400 may be described with reference to an x-direction, a y-direction, and a z-direction of a coordinate system 401. The z-direction may be illustrative of a direction perpendicular to a surface of the substrate 220-a (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105).

The memory structure 400 illustrates an example of memory arrays 110 associated with different levels 420 (e.g., different decks, a stack of decks, a stack of levels). For example, the memory array 110-b-1 may be associated with a level 420-a-1 at a first height or position relative to the substrate 220-a, and the memory array 110-b-2 may be associated with a level 420-a-2 at a second (e.g., different) height or position relative to the substrate 220-a (e.g., above the level 420-a-1, relative to the substrate 220-a). Although the memory structure 400 illustrates an example with two levels 420-a, the described techniques may be applied in a memory structure having any quantity of two or more levels 420.

At least some, if not each of the memory arrays 110-b may include a respective set of memory cells 105-b arranged or addressed according to rows (e.g., aligned along the y-direction, addressed according to a position along the x-direction) and columns (e.g., aligned along the x-direction, addressed according to a position along the y-direction). For example, a column of the memory array 110-b-1 may include n memory cells 105-b-11 through 105-b-1n, and may be associated with (e.g., formed upon, formed in contact with, coupled with) a digit line conductor 410-a-11 (e.g., an example of a digit line 130). In some examples, a column of the memory array 110-b-2 may include a same quantity of memory cells 105-b, which may or may not be physically aligned (e.g., along the z-direction) or overlapping (e.g., when viewed in an xy-plane) with the memory cells 105-b of the memory array 110-b-1. A quantity of columns, m, may be formed by repeating the illustrated memory cells 105 and digit line conductors 410-a, among other features, along the y-direction.

At least some, if not each of the memory cells 105-b in the memory structure 400 may include a respective capacitor 320-b and a respective cell selection component 330-b (e.g., a transistor). In the example of memory structure 400, each of the cell selection components 330-b may be formed as a vertical transistor, which may include a channel portion (e.g., a vertical channel) formed at least in part by a respective pillar 430-a, or portion thereof (e.g., along the z-direction), and a gate portion formed at least in part by a respective word line conductor 440-a (e.g., an example of a word line 120). In some examples, the gate portion of a cell selection component 330-b may be a portion or a region of a word line 120 or word line conductor 440-a that is operable to activate the channel portion (e.g., to modulate a conductivity of the channel portion) of the cell selection component 330-b. The word line conductors 440-a may extend from one memory cell 105-b to another memory cell 105-b along a direction, such as the y-direction (e.g., a row direction, along a row of memory cells 105-b), and may be coupled with a row component 125 (not shown) for selecting or activating a row of memory cells 105-b (e.g., by biasing the word line conductors 440-a).

In some examples, word line conductors 440-a of one memory array 110-b (e.g., memory array 110-b-1) may be coupled or connected with word line conductors 440-a of another memory array 110-b (e.g., memory array 110-b-2), such that rows of memory cells 105-b may be commonly activated across multiple memory arrays 110-b or multiple levels 420-a (e.g., by a common node or output of a shared row component 125, not shown). In some examples, interconnections between word line conductors 440-a of different levels 420-a may be formed at least in part along the z-direction by one or more vias, sockets, or TSVs, which may be located at or near a boundary of the memory arrays 110-b (e.g., along the y-direction), among other locations relative to the memory arrays 110-b.

Each capacitor 320-b for a memory cell 105-b may include a respective dielectric portion 450-a formed between a pillar 430-a associated with the memory cell 105-b and a plate conductor 460-a (e.g., an example of a plate line 140, a plate node, or a common plate). In some examples, a portion of a pillar 430-a of a capacitor 320-b may be a same material or combination of materials as a portion of the pillar 430-a of a corresponding cell selection component 330-b (e.g., a doped semiconductor material, a polycrystalline semiconductor). In some examples, a portion of a pillar 430-a of capacitor 320-b may be or include a different material or combination of materials as a portion of the pillar 430-a of a corresponding cell selection component 330-b (e.g., a metal or conductor portion, a metal layer deposited over a surface of the pillar 430-a). In some examples, the dielectric portions 450-a may be formed with a ferroelectric material operable to maintain a non-zero electric charge (e.g., corresponding to a stored logic state) in the absence of an electric field.

In the example of memory structure 400, the memory array 110-b-1 may be associated with (e.g., coupled with, include, be accessed using) a plate conductor 460-a-1 and the memory array 110-b-2 may be associated with (e.g., coupled with, include, be accessed using) a plate conductor 460-a-2. Each of the plate conductors 460-a may be coupled with a plate component 145 (not shown) for biasing the plate conductors 460-*a*. In the example of memory structure 400, each plate conductor 460-*a* may be associated with at least a column of memory cells 105-*b*. In some examples, each of the plate conductors 460-*a* may also extend along the y-direction along a row of memory cells 105-*b*, in which case each of the plate conductors 460-*a* may be associated with all of the memory cells 105-*b* of a respective memory array 110-*b*. In some examples, a plate conductor 460-*a* may be a metal or other conductor formed over or between the dielectric portions 450-*a* of the memory cells 105-*b* of the respective memory array 110-*b*.

In the example of memory structure 400, each column of memory cells 105-*b* of each memory array 110-*b* may be associated with a respective transistor 380-*b*, which may also be formed as a vertical transistor. Each transistor 380-*b* may be operable to couple a respective digit line conductor 410-*a* with an intermediate line conductor 465-*a* (e.g., an example of an intermediate line 365). In the example of memory structure 400, each intermediate line conductor 465-*a* may be a combination of horizontal metal layers formed in contact with (e.g., above, opposite the digit line conductors 410-*a*) the pillars 470-*a* and a vertical portion coupled with the column decoder 360-*a* that may be formed by one or more vias, sockets, or TSVs. In the example of memory structure 400, to support m columns per memory array 110-*b*, m intermediate line conductors 465-*a* may be formed along the y-direction, and each intermediate line conductor 465-*a* may be coupled or connected with a transistor 380-*b* of each memory array 110-*b* or each level 420-*a* (e.g., intermediate line conductor 465-*a*-1 being coupled with transistors 380-*b*-11 and 380-*b*-21).

At least some, if not each deck selection transistor 380-*a* may include a channel portion (e.g., a vertical channel) formed at least in part by one or more respective pillars 470-*a* and a gate portion formed at least in part by one or more respective deck selection conductors 480-*a* (e.g., an example of a deck selection line 375). In some examples, the gate portion of a transistor 380-*b* may be a portion or a region of a deck selection line 375 that is operable to activate the channel portion (e.g., to modulate a conductivity of the channel portion) of the transistor 380-*b*. The deck selection conductors 480-*a* may extend from one column of memory cells 105-*b* to another, or from one transistor 380-*b* to another, along a direction, such as the y-direction (e.g., along a row direction, along a row of memory cells 105), and may be coupled with a deck decoder 370 (not shown) for selecting or activating a memory array 110-*b* (e.g., by biasing the deck selection conductors 480-*a*, by activating a row of transistors 380-*b*).

The set of m intermediate line conductors 465-*a* may be coupled with a column decoder 360-*a*, which may, in turn, be coupled with a sense component 150-*b* (e.g., via a plurality of signal lines 345). Accordingly, a combination of a deck decoder 370 (not shown) and the column decoder 360-*a*, may be used to multiplex, address, or otherwise selectively couple the digit line conductors 410-*a* of the memory arrays 110-*b*-*a* and 110-*b*-2 with the sense component 150-*b*, or sense amplifiers 340 thereof, to support various access operations. In some examples, circuitry of the deck decoder 370, the column decoder 360-*a*, or the sense component 150-*b* may be substrate-based, such as including transistors formed at least in part by a doped portion of the substrate 220-*a* (e.g., in accordance with the transistor structure 200, transistors configured in a CMOS arrangement). By including the transistors 380-*b* in locations above the substrate 220-*a*, the memory structure 400 may support improved flexibility for distributing decoding circuitry throughout a memory die, which may improve area utilization, or semiconductor material utilization, among other benefits.

In various examples, each of the pillars 430 and 470 may be operable to support at least a portion of a channel of a respective transistor (e.g., a channel or operable conductive path aligned along the z-direction, supporting an electrical coupling or conductive path between source and drain terminals based at least in part on a voltage of a respective gate portion, gate terminal, or gate conductor), and may include one or more doped semiconductor portions. For example, to support an n-type transistor, a pillar 430 or a pillar 470 may include at least a p-type semiconductor portion, or may include a stack (e.g., in the z-direction) of an n-type semiconductor, a p-type semiconductor, and an n-type semiconductor (e.g., in an NPN arrangement along the z-direction), among other constituent materials or arrangements. To support a p-type transistor, a pillar 430 or a pillar 470 may include at least an n-type semiconductor portion, or may include a stack (e.g., along the z-direction) of a p-type semiconductor, an n-type semiconductor, and a p-type semiconductor (e.g., in an PNP arrangement in the z-direction), among other constituent materials or arrangements. In some examples, a pillar as described herein (e.g., a pillar 430, a pillar 470) may include one or more electrodes or electrode portions, such as an electrode at one or both ends of the pillar (e.g., a top end, a bottom end, or both).

Each of the pillars 430 and 470 may be associated with a height or a height dimension relative to the substrate (e.g., a lower extent in the z-direction, an upper extent in the z-direction, a span in the z-direction), which may be defined as part of balancing various performance criteria of the memory arrays 110. In some examples, a height dimension or extent in the z-direction of the pillars 430 of a memory array 110 may be the same as or at least partially overlapping with a height dimension or extent in the z-direction of the pillars 470 of the memory array 110. For example, each of the pillars 430 and 470 may have a common height dimension (e.g., a common upper extent, a common lower extent, or both) relative to the substrate. In some examples, the pillars 430 may have a height or a height dimension that is different than the pillars 470, such as the pillars 430 having an extended height along the z-direction to support one or more features of the capacitors 320. The pillars 430 and 470 may be formed with various cross-sectional shapes (e.g., in an xy-plane), such as a square shape, a rectangular shape, a circular shape, an oval shape, or a polygonal shape, among others, where pillars 430 and 470 may have common or different shapes, or common or different dimensions.

The pillars 430 and 470 may be formed according to various techniques. In some examples, one or more layers or stacks of layers of doped semiconductor material may be deposited on or above a substrate (e.g., on or in contact with a digit line conductor 410, or corresponding metal layer), and portions of the deposited layers located between respective pillars 430 and 470 (e.g., along the x-direction, along the y-direction) may be etched away or trenched to form the respective pillars. In some examples, pillars 430 and 470 may be formed from the same material or combination of materials (e.g., from a same layer or stack of layers). In some examples, such layers may include one or more electrode layers, such as an electrode layer above a stack of doped semiconductor material layers, an electrode layer below a stack of doped semiconductor material layers, or both, and such electrode layers may be or may not be etched or trenched along with the pillar formation processes. Additionally or alternatively, in some examples, holes or trenches may be etched through a material (e.g., in the z-direction, through a dielectric material, through a gate dielectric material) and material for the pillars 430 and 470 (e.g., one or more doped semiconductor materials, one or more electrode materials) may be deposited in the etched holes or trenches. In examples where pillar material is deposited into holes, trenches, or other recesses, pillars 430 and 470 may or may not be formed from a same material or combination of materials.

In various examples, a quantity or configuration of pillars 430 and 470 for a respective transistor may be defined or chosen for particular characteristics, such as an associated drive strength (e.g., drive current), impedance, activation threshold, or leakage characteristic of a particular transistor or set of transistors. In some examples, multiple pillars 430 or multiple pillars 470 may be described as or configured as parallel physical structures (e.g., parallel channels) of a common transistor or transistor component. For example, as illustrated, each of the transistors 380-$b$ may include or be otherwise formed with two pillars 470-$a$. However, in other examples, a transistor 380 or a cell selection component 330 may include or be otherwise formed with any quantity of one or more pillars 470 or 430, respectively. Likewise, in various examples, a capacitor 320 may be formed with or over any quantity of one or more pillars 430. In some examples, each pillar 430 or 470 of a set that is configured in parallel (e.g., commonly activated) may be described as or configured as a component of single transistor, such that a corresponding cell selection or deck selection may be described as or configured as having multiple transistors in a parallel arrangement.

In some examples, word line conductors 440 and deck selection conductors 480 of a given memory array 110 may be formed using one or more common operations, one or more common materials, or otherwise share various aspects of formation or configuration. For example, word line conductors 440 and deck selection conductors 480 may be formed using one or more common conductor formation processes (e.g., a common masking process, a common etching process, a common deposition process, or various combinations thereof). In some examples, word line conductors 440 and deck selection conductors 480 may be formed with a height dimension that is within or overlapping with a height dimension of at least doped semiconductor portions of the pillars 430 and 470 (e.g., supporting the function of modulating a conductivity through channel portions of the cell selection components 330 and transistors 380, respectively).

In various examples, word line conductors 440 and deck selection conductors 480 may be formed from a metal or metal alloy (e.g., copper, tungsten, gold, silver, tin, aluminum, or alloys thereof). Such conductors may be separated from pillars 430 or 470 (along the x-direction, along the y-direction, along the x-direction and the y-direction, in a radial direction) by a gate dielectric that is in contact with portions of the conductor and the respective pillar. In some examples, gate conductors may be located alongside the respective pillars (e.g., as a transverse gate, as a pass-by gate, as a pair of gate conductors on either or both sides of a pillar), including conductors extending between the pillars along the y-direction and separated from pillars along the x-direction by a gate dielectric. In some examples, gate conductors may include at least a portion that wraps (e.g., partially, entirely) around respective pillars (e.g., as a wrap-around gate, as a circumferential gate, as an all-around gate), where at least the respective pillars a may be wrapped (e.g., partially wrapped, entirely wrapped) with a circumferential gate dielectric that is in contact with the pillar and the conductor. In various examples, the digit line conductors 410 or intermediate line conductors 465, among other components such as conductors, may be formed from a metal or metal alloy, which may be a same material or a different material as conductors used to support transistor gate portions (e.g., word line conductors 440, deck selection conductors 480).

In some examples, circuitry of a deck decoder 370 (not shown), the column decoder 360-$a$, or the sense component 150-$b$, or any combination thereof may be substrate-based, such as including transistors formed at least in part by a doped portion of the substrate 220-$b$ (e.g., in accordance with the transistor structure 200, transistors configured in a CMOS arrangement). By including the transistors 380-$b$ in locations above the substrate 220-$a$, the memory structure 400 may support improved flexibility for distributing decoding circuitry throughout a memory die, which may improve area utilization, or semiconductor substrate material utilization, among other benefits.

Figure 5:
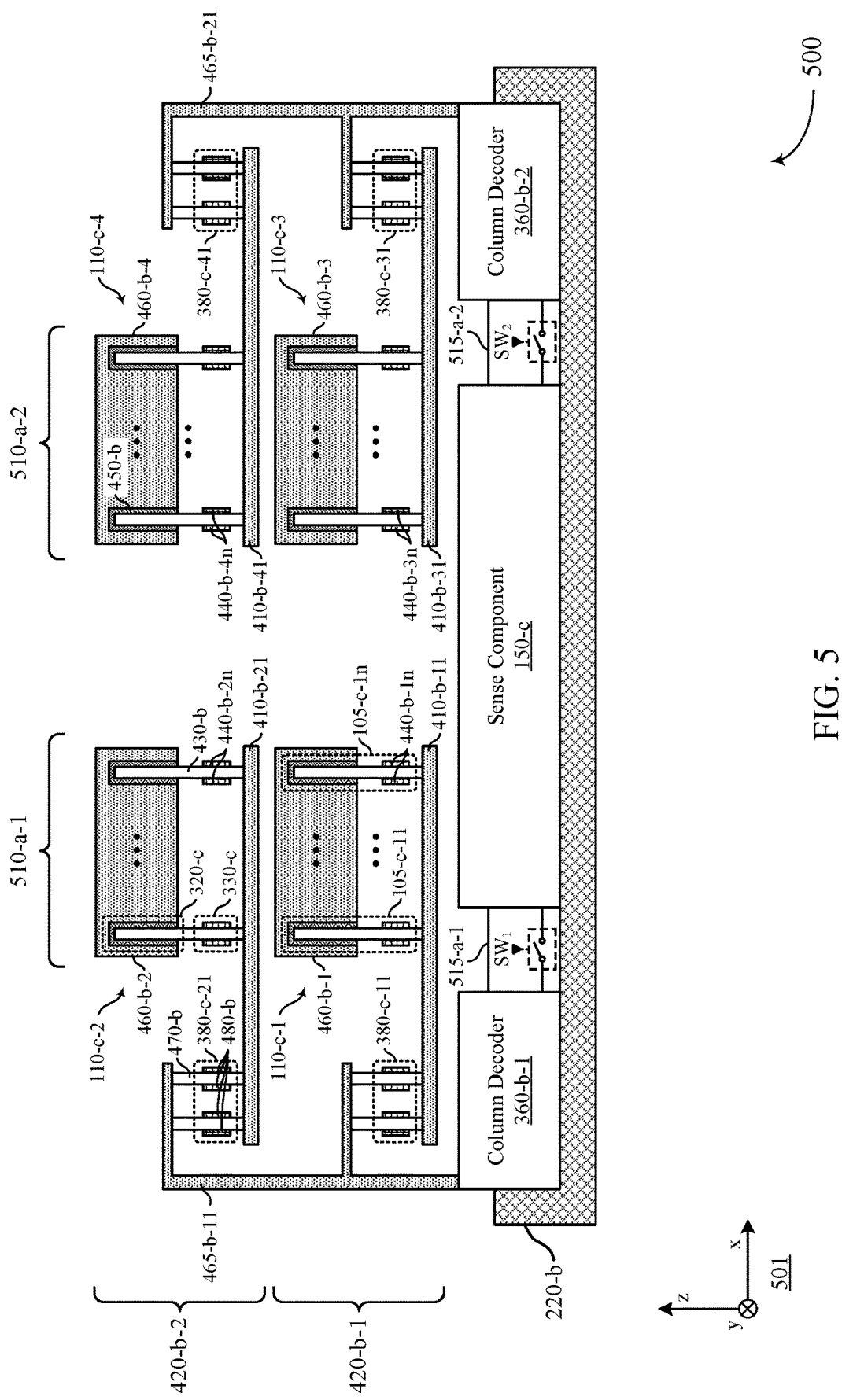

FIG. 5 illustrates an example layout of a memory structure 500 that supports thin film transistor deck selection in a memory device in accordance with examples as disclosed herein. The memory structure 500 may be illustrative of portions of a memory device 100 or memory die that may be formed with or over a substrate 220-$b$, which may be an example of a substrate 220 described with reference to FIG. 2. The memory structure 500 may illustrate examples for implementing aspects of the circuit 300 described with reference to FIG. 3. For illustrative purposes, aspects of the memory structure 500 may be described with reference to an x-direction, a y-direction, and a z-direction of a coordinate system 501. The z-direction may be illustrative of a direction perpendicular to a surface of the substrate 220-$b$ (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105). In some examples, the memory structure 500 may include alternative arrangements of components similar to those described with reference to the memory structure 400, including components with similar reference numerals, and descriptions of such components or their formation with reference to the memory structure 400 may be applicable to the components of the memory structure 500.

The memory structure 500 illustrates an example of memory arrays 110 associated with different levels 420. For example, the memory arrays 110-$c$-1 and 110-$c$-3 may be associated with a level 420-$b$-1 at a first height or position relative to the substrate 220-$b$, and the memory arrays 110-$c$-2 and 110-$c$-4 may be associated with a level 420-$b$-2 at a second (e.g., different) height or position relative to the substrate 220-$b$ (e.g., above the level 420-$b$-1, relative to the substrate 220-$b$). Although the memory structure 500 illustrates an example with two levels 420-$b$, the described techniques may be applied in a memory structure having any quantity of two or more levels 420.

The memory structure 500 also illustrates an example of memory arrays 110 associated with different sets 510 of memory arrays 110 (e.g., different subsets of memory arrays 110 that may have different locations over a substrate 220 along the x-direction, along the y-direction, or both). For example, the memory arrays 110-*c*-1 and 110-*c*-2 may be associated with a set 510-*a*-1 and the memory arrays 110-*c*-3 and 110-*c*-4 may be associated with a set 510-*a*-2. In some examples, memory arrays 110 of a set 510 may be coupled with or otherwise share a respective column decoder 360. For example, the set 510-*a*-1 may be associated with (e.g., coupled with, configured for access or addressing using) a column decoder 360-*b*-1, and the set 510-*a*-2 may be associated with a column decoder 360-*b*-2. In the example of memory structure 500, the set 510-*a*-1 and the set 510-*a*-2 may be coupled with or otherwise share a sense component 150-*c* (e.g., a sense component 150 common to or shared by each of the memory arrays 110-*c* of the sets 510-*a*), which may be accessible via the respective column decoder 360-*b* corresponding to the set 510-*a*. Although the memory structure 500 illustrates an example with two sets 510-*a*, the described techniques may be applied in a memory structure having any quantity of two or more sets 510 (e.g., and associated column decoders 360 that may be operable to couple with or otherwise share a common sense component 150-*c*).

At least some, if not each of the memory arrays 110-*c* may include a respective set of memory cells 105-*c* arranged or addressed according to rows (e.g., aligned along the y-direction, addressed according to a position along the x-direction) and columns (e.g., aligned along the x-direction, addressed according to a position along the y-direction). For example, a column of each of the memory arrays 110-*c* may include n memory cells, and each may be associated with (e.g., formed upon, formed in contact with, coupled with) a digit line conductor 410-*b* (e.g., an example of a digit line 130). A quantity of columns, m, may be formed by repeating the illustrated memory cells 105-*c* and digit line conductors 410-*b*, among other features, along the y-direction.

At least some, if not each of the memory cells 105-*c* in the memory structure 500 may include a respective capacitor 320-*c* and a respective cell selection component 330-*c* (e.g., a transistor). In the example of memory structure 500, each of the cell selection components 330-*c* may be formed as a vertical transistor, which may include a channel portion (e.g., a vertical channel) formed at least in part by a respective pillar 430-*b*, or portion thereof (e.g., along the z-direction), and a gate portion formed at least in part by a respective word line conductor 440-*b* (e.g., an example of a word line 120). In some examples, the gate portion of a cell selection component 330-*c* may be a portion or a region of a word line 120 or word line conductor 440-*b* that is operable to activate the channel portion (e.g., to modulate a conductivity of the channel portion) of the cell selection component 330-*c*. The word line conductors 440-*b* may extend from one memory cell 105-*c* to another memory cell 105-*c* along a direction, such as the y-direction (e.g., a row direction, along a row of memory cells 105-*c*), and may be coupled with a row component 125 (not shown) for selecting or activating a row of memory cells 105-*c* (e.g., by biasing the word line conductors 440-*b*).

In some examples, word line conductors 440-*b* of one memory array 110-*c* may be coupled or connected with word line conductors 440-*b* of another memory array 110-*c*, such that rows of memory cells 105-*c* may be commonly activated across multiple memory arrays 110-*c*, including memory arrays 110-*c* across multiple levels 420-*b*, or memory arrays 110-*c* across multiple sets 510-*a*, or both (e.g., by a common node or output of a shared row component 125, not shown). In examples that support a common, shared, or otherwise concurrent activation across memory arrays 110-*c* across multiple levels 420-*b*, the word line conductors 440-*b*-1*n* and 440-*b*-2*n* may be coupled with each other, or coupled with a common or shared output of a row component 125, or the word line conductors 440-*b*-3*n* and 440-*b*-4*n* may be coupled with each other, or coupled with a common or shared output of a row component 125, and so on. In examples that support a common, shared, or otherwise concurrent activation across memory arrays 110-*c* across multiple sets 510-*a*, the word line conductors 440-*b*-1*n* and 440-*b*-3*n* may be coupled with each other, or coupled with a common or shared output of a row component 125, or the word line conductors 440-*b*-2*n* and 440-*b*-4*n* may be coupled with each other, or coupled with a common or shared output of a row component 125, and so on. In examples that support a common, shared, or otherwise concurrent activation across memory arrays 110-*c* across multiple levels 420-*b* and sets 510-*a*, the word line conductors 440-*b*-1*n*, 440-*b*-2*n*, 440-*b*-3*n*, and 440-*b*-4*n* may be coupled with each other, or coupled with a common or shared output of a row component 125, and so on.

In some examples, interconnections between word line conductors 440-*b* of different levels 420-*b* may be formed at least in part along a direction such as the z-direction, by one or more vias, sockets, or TSVs, which may be located at or near a boundary of the memory arrays 110-*c* (e.g., along the y-direction), among other locations relative to the memory arrays 110-*c*. In some examples, interconnections between word line conductors 440-*b* of different sets 510-*a* may be formed at least in part along the x-direction by one or more routing levels or layers, which may be located at a different position along the z-direction than the memory arrays 110-*c*, such as locations above, below, or between the memory arrays 110-*c*, among other locations.

Each capacitor 320-*c* for a memory cell 105-*c* may include a respective dielectric portion 450-*b* formed between a pillar 430-*b* associated with the memory cell 105-*c* and a plate conductor 460-*b* (e.g., an example of a plate line 140, a plate node, or a common plate). In some examples, a portion of a pillar 430-*b* of a capacitor 320-*b* may be a same material or combination of materials as a portion of the pillar 430-*b* of a corresponding cell selection component 330-*c* (e.g., a doped semiconductor material, a polycrystalline semiconductor). In some examples, a portion of a pillar 430-*b* of capacitor 320-*c* may be or include a different material or combination of materials as a portion of the pillar 430-*b* of a corresponding cell selection component 330-*c* (e.g., a metal or conductor portion, a metal layer deposited over a surface of the pillar 430-*b*). In some examples, the dielectric portions 450-*b* may be formed with a ferroelectric material operable to maintain a non-zero electric charge (e.g., corresponding to a stored logic state) in the absence of an electric field.

In the example of memory structure 500, each of the memory arrays 110-*c* may be associated with (e.g., coupled with, include, be accessed using) a respective plate conductor 460-*b*. Each of the plate conductors 460-*b* may be coupled with a plate component 145 (not shown) for respectively biasing the plate conductors 460-*b*. In the example of memory structure 500, each plate conductor 460-*b* may be associated with at least a column of memory cells 105-*c*. In some examples, each of the plate conductors 460-*b* may also extend along the y-direction along a row of memory cells 105-*c*, in which case each of the plate conductors 460-*b* may be associated with all of the memory cells 105-*c* of a respective memory array 110-*c*.

In the example of memory structure 500, at least some, if not each column of memory cells 105-*c* of at least some, if not each memory array 110-c may be associated with a respective transistor 380-c, which may also be formed as a vertical transistor. At least some, if not each transistor 380-c may be operable to couple a respective digit line conductor 410-b with an intermediate line conductor 465-b (e.g., an example of an intermediate line 365). In the example of memory structure 500, to support m columns per memory array 110-c, m intermediate line conductors 465-b may be formed along the y-direction for each set 510-a, and each intermediate line conductor 465-b may be coupled or connected with a transistor 380-c of each memory array 110-c of each level 420-b of a set 510-a (e.g., intermediate line conductor 465-b-11 being coupled with transistors 380-c-11 and 380-c-21, intermediate line conductor 465-b-21 being coupled with transistors 380-c-31 and 380-c-41).

At least some, if not each deck selection transistor 380-c may include a channel portion (e.g., a vertical channel) formed at least in part by one or more respective pillars 470-b and a gate portion formed at least in part by one or more respective deck selection conductors 480-b (e.g., an example of a deck selection line 375). In some examples, the gate portion of a transistor 380-c may be a portion or a region of a deck selection line 375 that is operable to activate the channel portion (e.g., to modulate a conductivity of the channel portion) of the transistor 380-c. The deck selection conductors 480-b may extend from one column of memory cells 105-c to another, or from one transistor 380-c to another, along a direction, such as the y-direction (e.g., along a row direction, along a row of memory cells 105), and may be coupled with a deck decoder 370 (not shown) for selecting or activating a memory array 110-c (e.g., by biasing the deck selection conductors 480-b, by activating a row of transistors 380-c).

The set of m intermediate line conductors 465-b of each set 510-a may be coupled with a respective column decoder 360-b, which may, in turn, be coupled with or otherwise operable to couple with a sense component 150-c (e.g., a sense component 150 that may be common to each of the column decoders 360-b or all of the memory arrays 110-c, a sense component 150 operable to access memory cells 105-c of all or any of the memory arrays 110-c). In some examples, the memory structure 500 may include switching components 515 for coupling or isolating a respective column decoder 360-b and the sense component 150-c (e.g., according to a logic signal $SW_1$ to activate the switching component 515-a-1 and a logic signal $SW_2$ to activate the switching component 515-a-2). Although a single switching component 515-a is shown for each of the column decoders 360-b, in some examples, the memory structure 500 may include multiple switching components 515 (e.g., multiple switching components 515 per set 510-a), such as a switching component 515 for each signal line 345 (not shown) of a plurality of signal lines 345 between the respective column decoder 360-b and the sense component 150-c. In other examples, such functionality may be included in the column decoders 360-b, or included in the sense component 150-c, or distributed between the column decoders 360-b and the sense component 150-c, or any combination thereof, such that the column decoders 360-b may be otherwise operable to couple with the sense component 150-c. Accordingly, a combination of a deck decoder 370 (not shown), the column decoders 360-b, and one or more switching components 515 (where applicable) may be used to multiplex, address, or otherwise selectively couple the digit line conductors 410-b of the memory arrays 110-c-1 through 110-c-4 with the sense component 150-c, or sense amplifiers 340 thereof, to support various access operations.

Although the memory structure 500 illustrates an example where intermediate line conductors 465-b and column decoders 360-b are located towards an outer extent along the x-direction, and the sense component 150-c is centrally located (e.g., between the column decoders 360-b) along the x-direction, the components of the memory structure 500 may be alternatively arranged. For example, each of the sets 510-a and corresponding circuitry may be reflected across a yz-plane, such that the intermediate line conductors 465-b and column decoders 360-b may be centrally located (e.g., between the memory arrays 110-c, relatively closer to a middle dimension along the x-direction than an extend of the memory arrays 110-c) along the x-direction, and the digit line conductors 410-b and memory arrays 110-c of each set 510-a may extend toward the outer extents along the x-direction. In some examples, the sense component 150-c may still be centrally located, such as being centrally located between the column decoders 360-b-1 and 360-b-2. In some examples, the sense component 150-c may be located in a different location, such as being located at a different position on the substrate 220-b along the y-direction, at a different position along the x-direction (e.g., on a same side along the x-direction as both column decoders 360-b-1 and 360-b-2), or at a different position in the z-direction (e.g., above or below the column decoders 360-b), among other locations.

In some examples, circuitry of a deck decoder 370 (not shown), the column decoders 360-b, the switching components 515 (where applicable), or the sense component 150-c, or any combination thereof may be substrate-based, such as including transistors formed at least in part by a doped portion of the substrate 220-b (e.g., in accordance with the transistor structure 200, transistors configured in a CMOS arrangement). By including the transistors 380-c in locations above the substrate 220-b, the memory structure 500 may support improved flexibility for distributing decoding circuitry throughout a memory die, which may improve area utilization, or semiconductor substrate material utilization, among other benefits. Moreover, by including a sense component 150-c that is accessible by different column decoders 360-b (e.g., a sense component 150 that is common to or shared by the column decoders 360-b), the memory structure 500 may support improved flexibility for decoding, addressing, or other operations. For example, a first column decoder 360-b may be coupled with the sense component 150-c while a second column decoder 360-b is isolated from the sense component 150-c, which may support some operations being performed via the first column decoder 360-b using the sense component 150-c (e.g., sensing of logic states stored by memory cells 105 of one of the memory arrays 110-c) and other operations being performed without using the sense component 150-c (e.g., row selection or biasing, column selection or biasing, deck selection, signal development, which may be isolated from the sense component 150-c via the second column decoder 360-b or an associated switching component 515). In some examples, such techniques may support a degree of parallel operation among the memory arrays 110-c.

Figure 6:
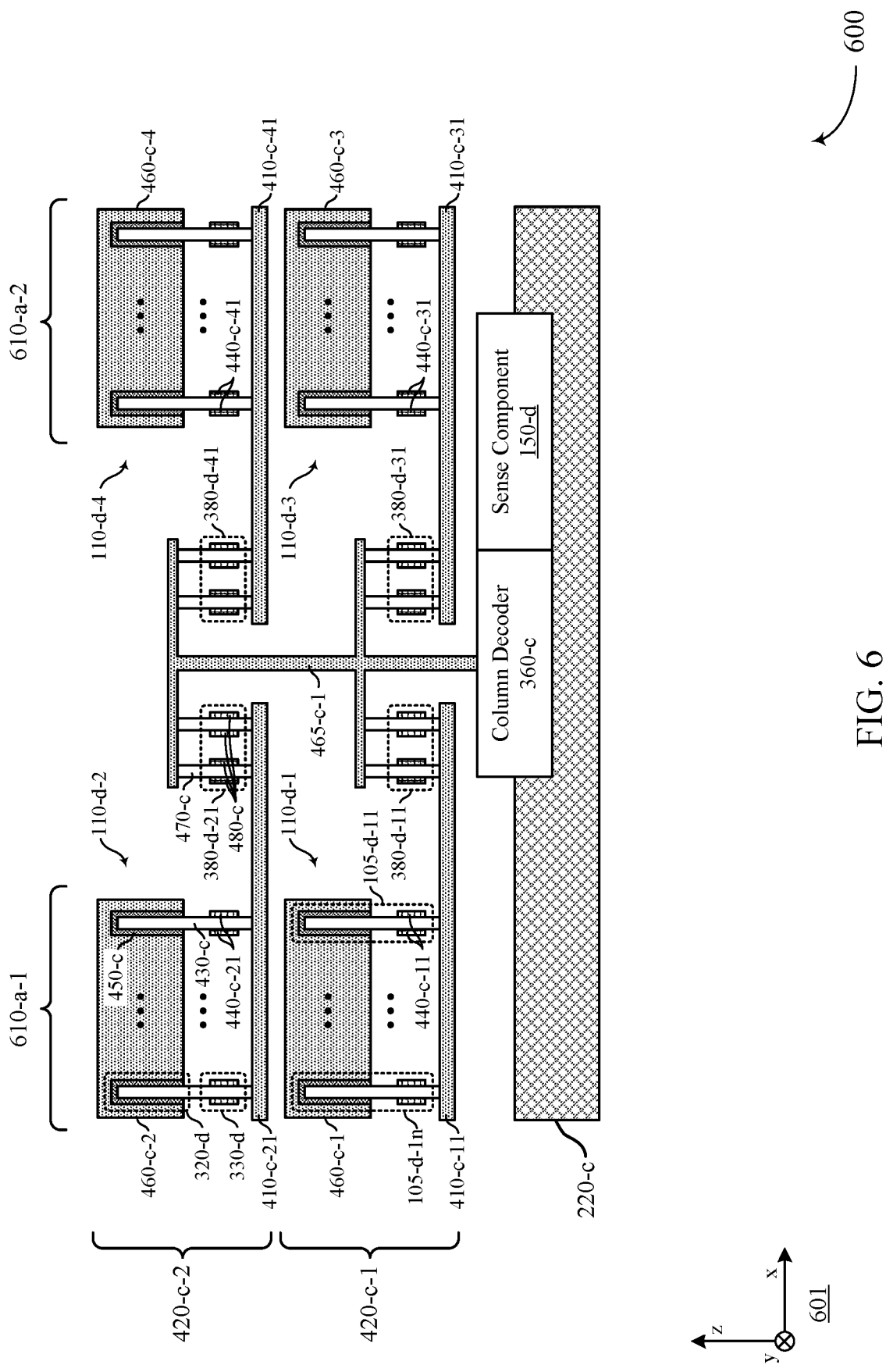

FIG. 6 illustrates an example layout of a memory structure 600 that supports thin film transistor deck selection in a memory device in accordance with examples as disclosed herein. The memory structure 600 may be illustrative of portions of a memory device 100 or memory die that may be formed with or over a substrate 220-c, which may be an example of a substrate 220 described with reference to FIG. 2. The memory structure 600 may illustrate examples for implementing aspects of the circuit 300 described with reference to FIG. 3. For illustrative purposes, aspects of the memory structure 600 may be described with reference to an x-direction, a y-direction, and a z-direction of a coordinate system 601. The z-direction may be illustrative of a direction perpendicular to a surface of the substrate 220-c (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105). In some examples, the memory structure 600 may include alternative arrangements of components similar to those described with reference to the memory structure 400, including components with similar reference numerals, and descriptions of such components or their formation with reference to the memory structure 400 may be applicable to the components of the memory structure 600.

The memory structure 600 illustrates an example of memory arrays 110 associated with different levels 420. For example, the memory arrays 110-d-1 and 110-d-3 may be associated with a level 420-c-1 at a first height or position relative to the substrate 220-c, and the memory arrays 110-d-2 and 110-d-4 may be associated with a level 420-c-2 at a second (e.g., different) height or position relative to the substrate 220-c (e.g., above the level 420-c-1, relative to the substrate 220-c). Although the memory structure 600 illustrates an example with two levels 420-c, the described techniques may be applied in a memory structure having any quantity of two or more levels 420.

The memory structure 600 also illustrates an example of memory arrays 110 associated with different sets 610 of memory arrays 110 (e.g., different subsets of memory arrays 110 that may have different locations over a substrate 220 along the x-direction, along the y-direction, or both). For example, the memory arrays 110-d-1 and 110-d-2 may be associated with a set 610-a-1 and the memory arrays 110-d-3 and 110-d-4 may be associated with a set 610-a-2. In some examples, memory arrays 110 of the sets 610 may be coupled with or otherwise share a same column decoder 360, but different sets 610 may be located on different sides or positions relative to common intermediate line conductors 465 or other circuitry. For example, the set 610-a-1 may be located on a first side of the intermediate line conductors 465-c (e.g., a left side) and the set 610-a-2 may be located on a second side of the intermediate line conductors 465-c (e.g., a right side).

At least some, if not each of the memory arrays 110-d may include a respective set of memory cells 105-d arranged or addressed according to rows (e.g., aligned along the y-direction, addressed according to a position along the x-direction) and columns (e.g., aligned along the x-direction, addressed according to a position along the y-direction). For example, a column of each of the memory arrays 110-d may include n memory cells, and each may be associated with (e.g., formed upon, formed in contact with, coupled with) a digit line conductor 410-c (e.g., an example of a digit line 130). A quantity of columns, m, may be formed by repeating the illustrated memory cells 105-d and digit line conductors 410-c, among other features, along the y-direction.

At least some, if not each of the memory cells 105-d in the memory structure 600 may include a respective capacitor 320-d and a respective cell selection component 330-d (e.g., a transistor). In the example of memory structure 600, each of the cell selection components 330-d may be formed as a vertical transistor, which may include a channel portion (e.g., a vertical channel) formed at least in part by a respective pillar 430-c, or portion thereof (e.g., along the z-direction), and a gate portion formed at least in part by a respective word line conductor 440-c (e.g., an example of a word line 120). In some examples, the gate portion of a cell selection component 330-d may be a portion or a region of a word line 120 or word line conductor 440-c that is operable to activate the channel portion (e.g., to modulate a conductivity of the channel portion) of the cell selection component 330-d. The word line conductors 440-c may extend from one memory cell 105-d to another memory cell 105-d along a direction, such as the y-direction (e.g., a row direction, along a row of memory cells 105-d), and may be coupled with a row component 125 (not shown) for selecting or activating a row of memory cells 105-d (e.g., by biasing the word line conductors 440-c).

In some examples, word line conductors 440-c of one memory array 110-d may be coupled or connected with word line conductors 440-c of another memory array 110-d, such that rows of memory cells 105-d may be commonly activated across multiple memory arrays 110-d, including memory arrays 110-d across multiple levels 420-c, or memory arrays 110-d across multiple sets 610-a, or both (e.g., by a common node or output of a shared row component 125, not shown). In examples that support a common, shared, or otherwise concurrent activation across memory arrays 110-d across multiple levels 420-c, the word line conductors 440-c-11 and 440-c-21 may be coupled with each other, or coupled with a common or shared output of a row component 125, or the word line conductors 440-c-31 and 440-c-41 may be coupled with each other, or coupled with a common or shared output of a row component 125, and so on. In examples that support a common, shared, or otherwise concurrent activation across memory arrays 110-d across multiple sets 610-a, the word line conductors 440-c-11 and 440-c-31 may be coupled with each other, or coupled with a common or shared output of a row component 125, or the word line conductors 440-c-21 and 440-c-41 may be coupled with each other, or coupled with a common or shared output of a row component 125, and so on. In examples that support a common, shared, or otherwise concurrent activation across memory arrays 110-d across multiple levels 420-c and sets 610-a, the word line conductors 440-c-11, 440-c-21, 440-c-31, and 440-c-41 may be coupled with each other, or coupled with a common or shared output of a row component 125, and so on.

In some examples, interconnections between word line conductors 440-c of different levels 420-c may be formed at least in part along a direction, such as the z-direction by one or more vias, sockets, or TSVs, which may be located at or near a boundary of the memory arrays 110-d (e.g., along the y-direction), among other locations relative to the memory arrays 110-d. In some examples, interconnections between word line conductors 440-c of different sets 610-a may be formed at least in part along the x-direction by one or more routing levels or layers, which may be located at a different position along the z-direction than the memory arrays 110-d, such as locations above, below, or between the memory arrays 110-d, among other locations.

At least some if not each capacitor 320-d for a memory cell 105-d may include a respective dielectric portion 450-c formed between a pillar 430-c associated with the memory cell 105-d and a plate conductor 460-c (e.g., an example of a plate line 140, a plate node, or a common plate). In some examples, a portion of a pillar 430-*c* of a capacitor 320-*d* may be a same material or combination of materials as a portion of the pillar 430-*c* of a corresponding cell selection component 330-*d* (e.g., a doped semiconductor material, a polycrystalline semiconductor). In some examples, a portion of a pillar 430-*c* of capacitor 320-*d* may be or include a different material or combination of materials as a portion of the pillar 430-*c* of a corresponding cell selection component 330-*d* (e.g., a metal or conductor portion, a metal layer deposited over a surface of the pillar 430-*c*). In some examples, the dielectric portions 450-*c* may be formed with a ferroelectric material operable to maintain a non-zero electric charge (e.g., corresponding to a stored logic state) in the absence of an electric field.

In the example of memory structure 600, at least some, if not each of the memory arrays 110-*d* may be associated with (e.g., coupled with, include, be accessed using) a respective plate conductor 460-*c*. At least some, if not each of the plate conductors 460-*c* may be coupled with a plate component 145 (not shown) for respectively biasing the plate conductors 460-*c*. In the example of memory structure 600, each plate conductor 460-*c* may be associated with at least a column of memory cells 105-*d*. In some examples, each of the plate conductors 460-*c* may also extend along the y-direction along a row of memory cells 105-*d*, in which case each of the plate conductors 460-*c* may be associated with all of the memory cells 105-*d* of a respective memory array 110-*d*.

In the example of memory structure 600, at least some, if not each column of memory cells 105-*d* of at least some, if not each memory array 110-*d* may be associated with a respective transistor 380-*d*, which may also be formed as a vertical transistor. At least some, if not each transistor 380-*d* may be operable to couple a respective digit line conductor 410-*c* with an intermediate line conductor 465-*c* (e.g., an example of an intermediate line 365). In the example of memory structure 600, to support m columns per memory array 110-*d*, m intermediate line conductors 465-*c* may be formed along the y-direction, and each intermediate line conductor 465-*c* may be coupled or connected with a transistor 380-*d* of each memory array 110-*d* of each of the levels 420-*c* and each of the sets 610-*a* (e.g., intermediate line conductor 465-*c*-1 being coupled with transistors 380-*d*-11, 380-*d*-21, 380-*d*-31 and 380-*d*-41). The set of m intermediate line conductors 465-*c* may be coupled with a column decoder 360-*c*, which may, in turn, be coupled with or otherwise operable to couple with a sense component 150-*d*.

At least some, if not each deck selection transistor 380-*d* may include a channel portion (e.g., a vertical channel) formed at least in part by one or more respective pillars 470-*c* and a gate portion formed at least in part by one or more respective deck selection conductors 480-*c* (e.g., an example of a deck selection line 375). In some examples, the gate portion of a transistor 380-*d* may be a portion or a region of a deck selection line 375 that is operable to activate the channel portion (e.g., to modulate a conductivity of the channel portion) of the transistor 380-*d*. The deck selection conductors 480-*c* may extend from one column of memory cells 105-*d* to another, or from one transistor 380-*d* to another, along a direction, such as the y-direction (e.g., along a row direction, along a row of memory cells 105), and may be coupled with a deck decoder 370 (not shown) for selecting or activating a memory array 110-*d* (e.g., by biasing the deck selection conductors 480-*c*, by activating a row of transistors 380-*d*).

In some examples, circuitry of a deck decoder 370 (not shown), the column decoder 360-*c*, or the sense component 150-*d*, or any combination thereof may be substrate-based, such as including transistors formed at least in part by a doped portion of the substrate 220-*c* (e.g., in accordance with the transistor structure 200, transistors configured in a CMOS arrangement). By including the transistors 380-*d* in locations above the substrate 220-*c*, the memory structure 600 may support improved flexibility for distributing decoding circuitry throughout a memory die, which may improve area utilization, or semiconductor substrate material utilization, among other benefits. Moreover, by implementing common intermediate line conductors 465-*c* and a common column decoder 360-*c* for different levels 420-*a* and different sets 610-*a*, the memory structure 600 may further leverage distributed deck selection by separately addressing multiple memory arrays 110-*d* of a same level 420-*c*. Such techniques may further improve area utilization or semiconductor substrate material utilization, and also may be implemented for selecting subsets of memory cells 105-*d* that are associated with relatively shorter digit line conductors 410-*c*, or for isolating a greater quantity of memory cells 105-*d* that are not targeted for access operations (e.g., by deactivating transistors 380-*d* to effectively isolate non-selected memory arrays 110-*d*). In some examples, such techniques may reduce an intrinsic capacitance of conductors between targeted memory cells 105-*d* and the sense component 150-*d*, or may reduce an amount of charge leakage during access operations (e.g., via non-selected memory arrays 110-*d*), which may improve read margins, improve write margins, or reduce power consumption, among other benefits.

Figure 7:
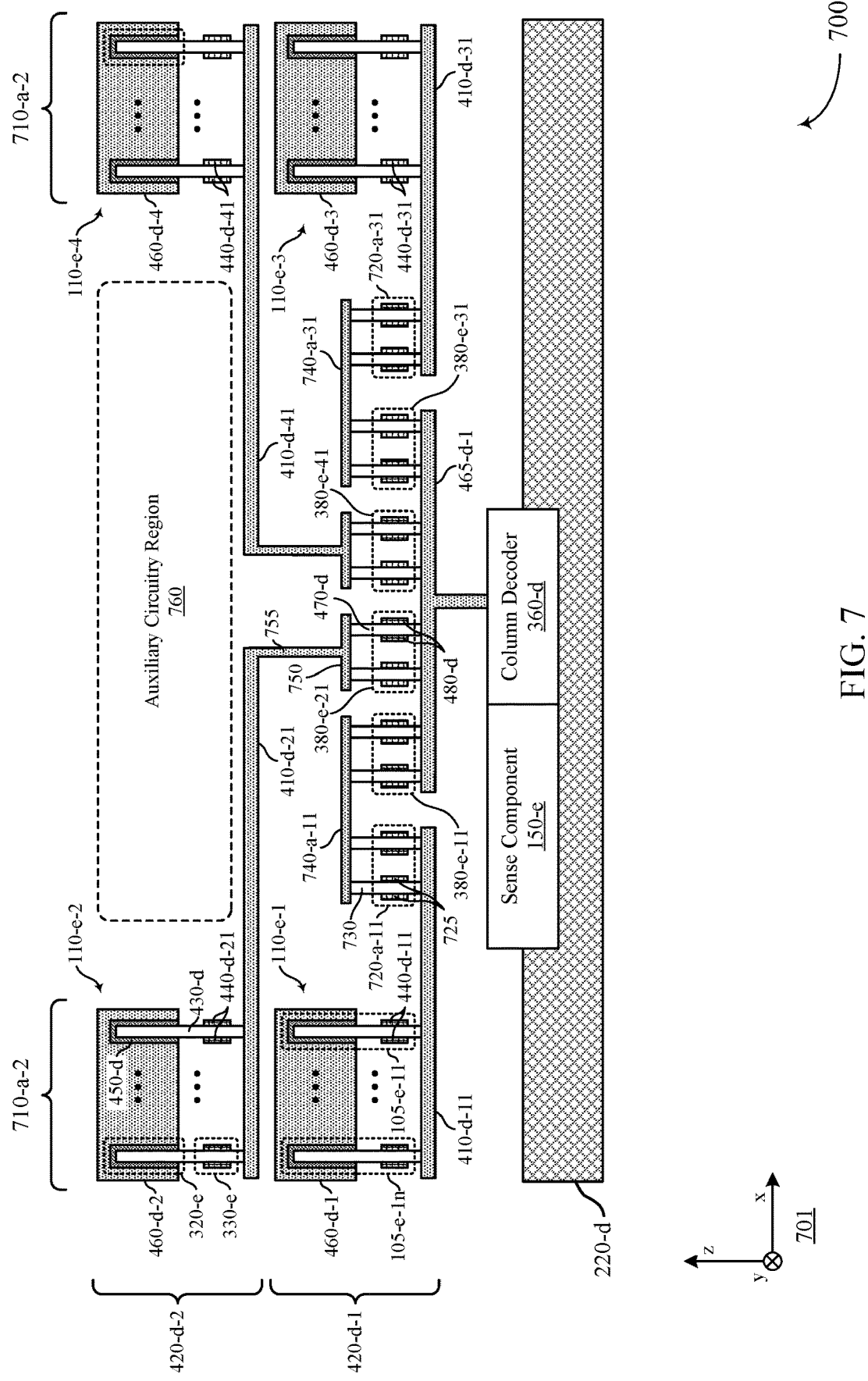

FIG. 7 illustrates an example layout of a memory structure 700 that supports thin film transistor deck selection in a memory device in accordance with examples as disclosed herein. The memory structure 700 may be illustrative of portions of a memory device 100 or memory die that may be formed with or over a substrate 220-*d*, which may be an example of a substrate 220 described with reference to FIG. 2. The memory structure 700 may illustrate examples for implementing aspects of the circuit 300 described with reference to FIG. 3. For illustrative purposes, aspects of the memory structure 700 may be described with reference to an x-direction, a y-direction, and a z-direction of a coordinate system 701. The z-direction may be illustrative of a direction perpendicular to a surface of the substrate 220-*d* (e.g., a surface in an xy-plane, a surface upon or over which other materials may be deposited), and each of the related structures, illustrated by their respective cross section in an xz-plane, may extend for some distance, or be repeated for some quantity (e.g., according to a pitch dimension), or both along the y-direction. In some examples, for illustrative purposes, the x-direction may be aligned with or referred to as a column direction (e.g., along a column of memory cells), and the y-direction may be aligned with or referred to as a row direction (e.g., along a row of memory cells 105). In some examples, the memory structure 700 may include alternative arrangements of components similar to those described with reference to the memory structure 400, including components with similar reference numerals, and descriptions of such components or their formation with reference to the memory structure 400 may be applicable to the components of the memory structure 700.

The memory structure 700 illustrates an example of memory arrays 110 associated with different levels 420. For example, the memory arrays 110-*e*-1 and 110-*e*-3 may be associated with a level 420-*d*-1 at a first height or position relative to the substrate 220-*d*, and the memory arrays 110-*e*-2 and 110-*e*-4 may be associated with a level 420-*d*-2 at a second (e.g., different) height or position relative to the substrate 220-*d* (e.g., above the level 420-*d*-1, relative to the substrate 220-*d*). Although the memory structure 700 illustrates an example with two levels 420-*d*, the described techniques may be applied in a memory structure having any quantity of two or more levels 420.

The memory structure 700 also illustrates an example of memory arrays 110 associated with different sets 710 of memory arrays 110 (e.g., different subsets of memory arrays 110 that may have different locations over a substrate 220 along the x-direction, along the y-direction, or both). For example, the memory arrays 110-*e*-1 and 110-*e*-2 may be associated with a set 710-*a*-1 and the memory arrays 110-*e*-3 and 110-*e*-4 may be associated with a set 710-*a*-2. In some examples, memory arrays 110 of the sets 710 may be coupled with or otherwise share a same column decoder 360, but different sets 710 may be located on different sides or positions relative to common intermediate line conductors 465 or other circuitry. For example, the set 710-*a*-1 may be located on a first side of the intermediate line conductors 465-*d* (e.g., a left side) and the set 710-*a*-2 may be located on a second side of the intermediate line conductors 465-*d* (e.g., a right side).

At least some, if not each of the memory arrays 110-*e* may include a respective set of memory cells 105-*e* arranged or addressed according to rows (e.g., aligned along the y-direction, addressed according to a position along the x-direction) and columns (e.g., aligned along the x-direction, addressed according to a position along the y-direction). For example, a column of each of the memory arrays 110-*e* may include n memory cells, and each may be associated with (e.g., formed upon, formed in contact with, coupled with) a digit line conductor 410-*d* (e.g., an example of a digit line 130). A quantity of columns, m, may be formed by repeating the illustrated memory cells 105-*e* and digit line conductors 410-*d*, among other features, along the y-direction.

At least some, if not each of the memory cells 105-*e* in the memory structure 700 may include a respective capacitor 320-*e* and a respective cell selection component 330-*e* (e.g., a transistor). In the example of memory structure 700, each of the cell selection components 330-*e* may be formed as a vertical transistor, which may include a channel portion (e.g., a vertical channel) formed at least in part by a respective pillar 430-*d*, or portion thereof (e.g., along the z-direction), and a gate portion formed at least in part by a respective word line conductor 440-*d* (e.g., an example of a word line 120). In some examples, the gate portion of a cell selection component 330-*e* may be a portion or a region of a word line 120 or word line conductor 440-*d* that is operable to activate the channel portion (e.g., to modulate a conductivity of the channel portion) of the cell selection component 330-*e*. The word line conductors 440-*d* may extend from one memory cell 105-*e* to another memory cell 105-*e* along a direction, such as the y-direction (e.g., a row direction, along a row of memory cells 105-*e*), and may be coupled with a row component 125 (not shown) for selecting or activating a row of memory cells 105-*e* (e.g., by biasing the word line conductors 440-*d*).

In some examples, word line conductors 440-*d* of one memory array 110-*e* may be coupled or connected with word line conductors 440-*d* of another memory array 110-*e*, such that rows of memory cells 105-*e* may be commonly activated across multiple memory arrays 110-*e*, including memory arrays 110-*e* across multiple levels 420-*d*, or memory arrays 110-*e* across multiple sets 710-*a*, or both (e.g., by a common node or output of a shared row component 125, not shown). In examples that support a common, shared, or otherwise concurrent activation across memory arrays 110-*e* across multiple levels 420-*d*, the word line conductors 440-*d*-11 and 440-*d*-21 may be coupled with each other, or coupled with a common or shared output of a row component 125, or the word line conductors 440-*d*-31 and 440-*d*-41 may be coupled with each other, or coupled with a common or shared output of a row component 125, and so on. In examples that support a common, shared, or otherwise concurrent activation across memory arrays 110-*e* across multiple sets 710-*a*, the word line conductors 440-*d*-11 and 440-*d*-31 may be coupled with each other, or coupled with a common or shared output of a row component 125, or the word line conductors 440-*d*-21 and 440-*d*-41 may be coupled with each other, or coupled with a common or shared output of a row component 125, and so on. In examples that support a common, shared, or otherwise concurrent activation across memory arrays 110-*e* across multiple levels 420-*d* and sets 710-*a*, the word line conductors 440-*d*-11, 440-*d*-21, 440-*d*-31, and 440-*d*-41 may be coupled with each other, or coupled with a common or shared output of a row component 125, and so on.

In some examples, interconnections between word line conductors 440-*d* of different levels 420-*d* may be formed at least in part along a direction, such as the z-direction by one or more vias, sockets, or TSVs, which may be located at or near a boundary of the memory arrays 110-*e* (e.g., along the y-direction), among other locations relative to the memory arrays 110-*e*. In some examples, interconnections between word line conductors 440-*d* of different sets 710-*a* may be formed at least in part along the x-direction by one or more routing levels or layers, which may be located at a different position along the z-direction than the memory arrays 110-*e*, such as locations above, below, or between the memory arrays 110-*e*, among other locations.

Each capacitor 320-*e* for a memory cell 105-*e* may include a respective dielectric portion 450-*d* formed between a pillar 430-*d* associated with the memory cell 105-*e* and a plate conductor 460-*d* (e.g., an example of a plate line 140, a plate node, or a common plate). In some examples, a portion of a pillar 430-*d* of a capacitor 320-*e* may be a same material or combination of materials as a portion of the pillar 430-*c* of a corresponding cell selection component 330-*e* (e.g., a doped semiconductor material, a polycrystalline semiconductor). In some examples, a portion of a pillar 430-*d* of capacitor 320-*e* may be or include a different material or combination of materials as a portion of the pillar 430-*d* of a corresponding cell selection component 330-*e* (e.g., a metal or conductor portion, a metal layer deposited over a surface of the pillar 430-*d*). In some examples, the dielectric portions 450-*d* may be formed with a ferroelectric material operable to maintain a non-zero electric charge (e.g., corresponding to a stored logic state) in the absence of an electric field.

In the example of memory structure 700, each of the memory arrays 110-*e* may be associated with (e.g., coupled with, include, be accessed using) a respective plate conductor 460-*d*. Each of the plate conductors 460-*d* may be coupled with a plate component 145 (not shown) for respectively biasing the plate conductors 460-*d*. In the example of memory structure 700, each plate conductor 460-*d* may be associated with at least a column of memory cells 105-*e*. In some examples, each of the plate conductors 460-*d* may also extend along the y-direction along a row of memory cells 105-*e*, in which case each of the plate conductors 460-*d* may be associated with all of the memory cells 105-*e* of a respective memory array 110-*e*.

In the example of memory structure 700, at least some, if not each column of memory cells 105-*e* of at least some, if not each memory array 110-*e* may be associated with a respective transistor 380-*e*, which may also be formed as a vertical transistor. At least some, if not each transistor 380-*e* may be operable to couple a respective digit line conductor 410-*d* with an intermediate line conductor 465-*d* (e.g., an example of an intermediate line 365). In the example of memory structure 700, to support m columns per memory array 110-*e*, m intermediate line conductors 465-*d* may be formed along the y-direction, and each intermediate line conductor 465-*d* may be coupled or connected with a transistor 380-*e* associated with each memory array 110-*e* of each of the levels 420-*d* and each of the sets 710-*a* (e.g., intermediate line conductor 465-*d*-1 being coupled with transistors 380-*e*-11, 380-*e*-21, 380-*e*-31 and 380-*e*-41). The set of m intermediate line conductors 465-*d* may be coupled with a column decoder 360-*d*, which may, in turn, be coupled with or otherwise operable to couple with a sense component 150-*e*.

At least some, if not each deck selection transistor 380-*e* may include a channel portion (e.g., a vertical channel) formed at least in part by one or more respective pillars 470-*d* and a gate portion formed at least in part by one or more respective deck selection conductors 480-*d* (e.g., an example of a deck selection line 375). In some examples, the gate portion of a transistor 380-*e* may be a portion or a region of a deck selection line 375 that is operable to activate the channel portion (e.g., to modulate a conductivity of the channel portion) of the transistor 380-*e*. The deck selection conductors 480-*d* may extend from one column of memory cells 105-*e* to another, or from one transistor 380-*e* to another, along a direction, such as the y-direction (e.g., along a row direction, along a row of memory cells 105), and may be coupled with a deck decoder 370 (not shown) for selecting or activating a memory array 110-*e* (e.g., by biasing the deck selection conductors 480-*d*, by activating a row of transistors 380-*e*).

The example of memory structure 700 illustrates a configuration where each of the transistors 380 may be on a same level 420. For example, each of the transistors 380-*e*-11, 380-*e*-21, 380-*e*-31, and 380-*e*-41, and respective repetitions along the y-direction for a quantity of columns, may be within or otherwise associated with the level 420-*d*-1. In some examples, such a configuration may support the pillars 470-*d* and deck selection conductors 480-*d* for all the transistors 380-*e* of the memory structure 700 being formed with common processes, or being otherwise formed concurrently.

In some examples, the configuration of the memory structure 700 may be supported by respective conductors 740 operable for coupling between the intermediate line conductors 465-*d* and the digit line conductors 410-*d* of the level 420-*d*-1. For example, the conductor 740-*a*-11 may be operable for coupling between the intermediate line conductor 465-*d*-1 (e.g., via the transistor 380-*e*-11) and the digit line conductor 410-*d*-11 (e.g., via a transistor 720-*a*-11 or other circuitry), the conductor 740-*a*-31 may be operable for coupling between the intermediate line conductor 465-*d*-1 (e.g., via the transistor 380-*e*-31) and the digit line conductor 410-*d*-31 (e.g., via a transistor 720-*a*-31 or other circuitry), and so on.

In some examples, the conductors 740 may be formed as part of a metal layer processing, which may include various deposition operations, or etching operations, or both. In some examples, such processing may also include forming conductor portions 750 coupled with or otherwise associated with the each of the digit line conductors 410-*d* of the second level 420-*d*-2. Each of the conductor portions 750 may be coupled with the respective digit line conductor 410-*d* (e.g., along the z-direction) by a respective conductor portion 755 (e.g., a vertical conductor), which may include one or more vias, sockets, or TSVs between the digit line conductor 410-*d* and the respective conductor portion 750. In some examples, to relieve dimensional tolerances or precision requirements for connections between the levels 420-*d* (e.g., an "at pitch" tolerance, related to pitch or repetition of digit line conductors 410-*d* or memory cells 105-*e* along the y-direction, such as a column pitch), the conductor portions 755 may be implemented in a varying approach, such as a staggered approach, where conductor portions 755 of columns adjacent to each other along the y-direction may be located in different positions along the x-direction according to various staggering techniques or repetitions. A staggered approach may, among other benefits, improve interconnection accuracy or tolerance for interconnections between levels 420-*d*, or may support relatively larger cross-sectional area (e.g., in an xy-plane) for the top of the conductor portions 755 (e.g., an end relatively farther from the substrate 220-*d*) than at the bottom of the conductor portions 755, which may be associated with an etching process used to etch holes for depositing a conductive material for the conductor portions 755 (e.g., where such an etching process may expand an upper cross-section in an xy-plane as the etching proceeds downward along the z-direction).

At least some, if not each transistor 720-*a* may include a channel portion (e.g., a vertical channel) formed at least in part by one or more respective pillars 730 and a gate portion formed at least in part by one or more respective conductors 725. In some examples, the gate portion of a transistor 720-*a* may be a portion or a region of a conductor 725 that is operable to activate the channel portion (e.g., to modulate a conductivity of the channel portion) of the transistor 720-*a*. The conductors 725 may extend from one column of memory cells 105-*e* to another, or from one transistor 720-*a* to another, along a direction, such as the y-direction (e.g., along a row direction, along a row of memory cells 105).

In some examples, the pillars 730 may be formed with common processes, or common materials, as the pillars 470-*d*, in which case the transistors 720-*a* may be formed as a same type of transistor as the transistors 380-*e* (e.g., n-type transistors or p-type transistors). In some examples, the pillars 730 and pillars 470-*d* may be formed with different processes, or different materials, in which case the transistors 720-*a* may be formed as a different type of transistor than the transistors 380-*e*. Although the example of memory structure 700 illustrates an example with transistors 380-*e* coupled with (e.g., formed upon) the intermediate line conductors 465-*d* and the transistors 720-*a* coupled with (e.g., formed upon) the digit line conductors 410-*d*, in some examples, the relative positions may be swapped such that transistors 380-*e* may be coupled with (e.g., formed upon) the digit line conductors 410-*d* the and the transistors 720-*a* may be coupled with (e.g., formed upon) the intermediate line conductors 465-*d*.

The transistors 720-*a* may, in some examples, be activated according to various techniques to support the operation of the memory structure 700. In some examples, the transistors may be configured in an "always on" configuration, where the conductors 725 may be activated whenever power or voltage is applied to or provided to the memory structure 700, or whenever the memory structure 700 is operable for supporting access operations (e.g., operating in an active mode). In some examples, the transistors 720-a may be configured to be activated during an access of the first memory array, of the second memory array, of the third memory array, or of the fourth memory array, or of any combination thereof. In some examples, the transistors 720-a may be activated when a corresponding memory array 110-e is selected for an access operation, in which case the corresponding transistors 380-e and the corresponding transistors 720 may both be activated (e.g., activating the transistors 380-e-11 and 720-a-11, and the respective repeated transistors along the y-direction, during access of the memory array 110-e-1). In some examples, such a combined or concurrent activation may be performed using a deck decoder 370, among other circuitry. Although the example of memory structure 700 includes the transistors 720-a, in some examples, the transistors 720-a may be replaced with metal conductors (e.g., vias, sockets, TSVs) that electrically connect the digit line conductors 410-d with the respective conductors 740-a.

In some examples, circuitry of a deck decoder 370 (not shown), the column decoder 360-c, or the sense component 150-d, or any combination thereof may be substrate-based, such as including transistors formed at least in part by a doped portion of the substrate 220-c (e.g., in accordance with the transistor structure 200, transistors configured in a CMOS arrangement). By including the transistors 380-d in locations above the substrate 220-c, the memory structure 600 may support improved flexibility for distributing decoding circuitry throughout a memory die, which may improve area utilization, or semiconductor substrate material utilization, among other benefits. Moreover, in some examples, such a configuration may support an auxiliary circuitry region 760 (e.g., within or otherwise associated with the level 420-d-2) to be allocated to other circuitry that supports the operation of the memory structure 700. For example, the auxiliary circuitry region 760 may provide a region for forming power or voltage supply circuitry, such as capacitors that support power or voltage regulation or other signal conditioning for operation of the memory structure 700.

The examples of memory structures 400, 500, 600, and 700 illustrate various techniques for implementing deck selection in accordance with examples as disclosed herein, including techniques illustrated schematically in the circuit 300. In some examples, a memory device 100 or associated memory die may implement multiple instances of one of the memory structures 400, 500, 600, or 700. For example, any of the memory structures 400, 500, 600, or 700 may be associated with a cross-sectional area (e.g., a span or extent along the x-direction and y-direction, a span or extent in an xy-plane) or a pitch (e.g., a distance of repetition along the x-direction, a distance of repetition along the y-direction), and one or more aspects of the respective memory structure may be repeated or extended along the x-direction, or y-direction, or both to expand a storage capacity of a memory device 100 or associated memory die. In some examples, each such repetition may be independently operable or addressable, which may support various aspects of parallel or otherwise concurrent access operations among repetitions of the respective memory structure. In some examples, a memory device 100 or associated memory die may implement instances of two or more of the memory structures 400, 500, 600, or 700, or both, or may combine aspects of two or more of the respective memory structures.

Figure 8:
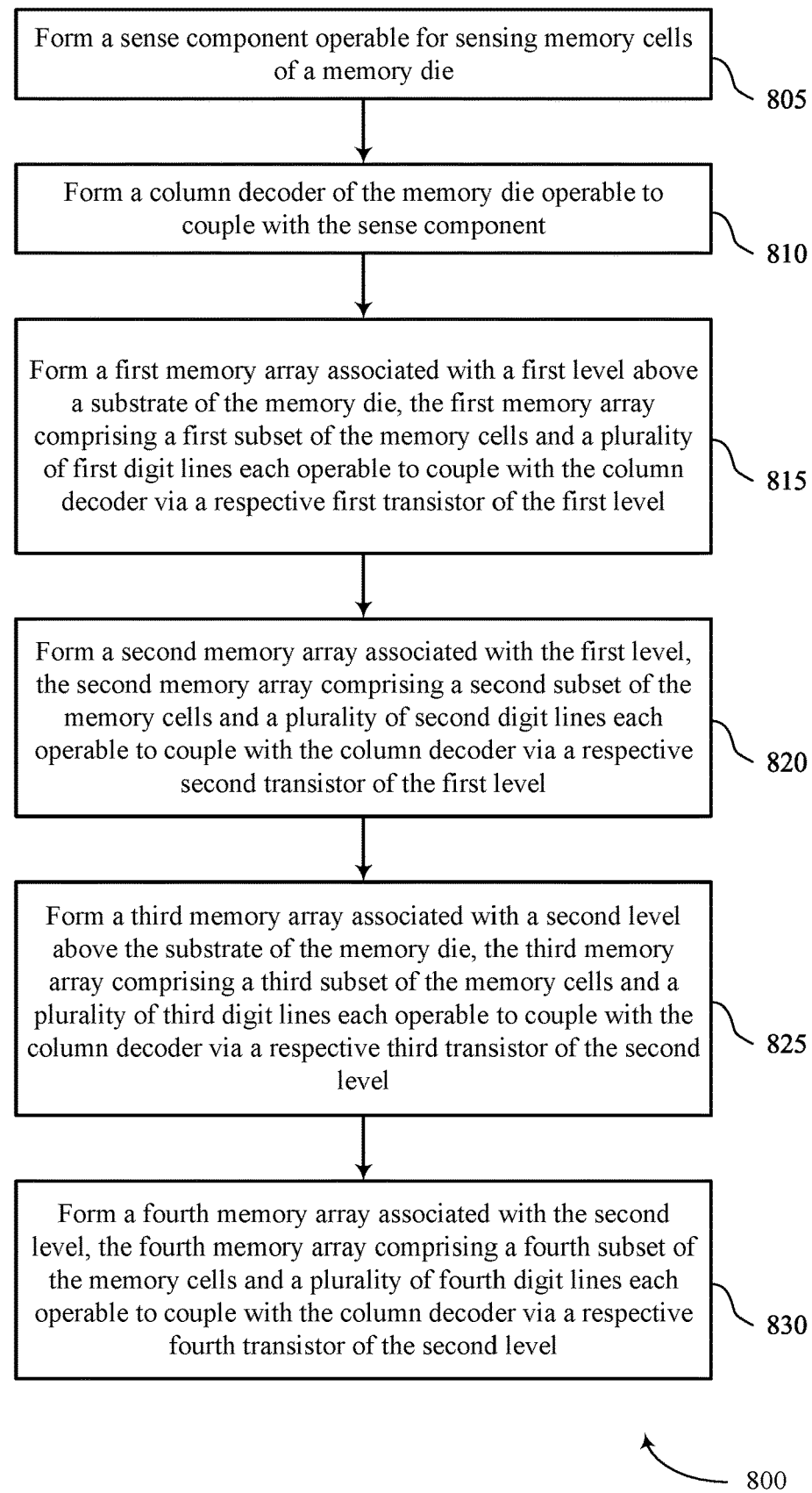
FIGS. 8 and 9 show flowcharts illustrating methods that support thin film transistor deck selection in a memory device in accordance with examples as disclosed herein.

FIG. 8 shows a flowchart illustrating a method 800 that supports thin film transistor deck selection in a memory device in accordance with examples as disclosed herein. The operations of method 800 may be implemented by a manufacturing system or one or more controllers associated with a manufacturing system. In some examples, one or more controllers may execute a set of instructions to control the functional elements of the manufacturing system to perform the described functions. Additionally or alternatively, one or more controllers may perform aspects of the described functions using special-purpose hardware.

At 805, the method may include forming a sense component (e.g., a sense component 150) operable for sensing memory cells of a memory die. The operations of 805 may be performed in accordance with examples and techniques as disclosed herein, including one or more aspects described with reference to FIGS. 1 through 3 and 6.

At 810, the method may include forming a column decoder (e.g., a column decoder 360) of the memory die operable to couple with the sense component. The operations of 810 may be performed in accordance with examples and techniques as disclosed herein, including one or more aspects described with reference to FIGS. 1 through 3 and 6.

At 815, the method may include forming a first memory array associated with a first level above a substrate of the memory die, the first memory array including a first subset of the memory cells and a plurality of first digit lines each operable to couple with the column decoder via a respective first transistor (e.g., a transistor 380) of the first level. The operations of 815 may be performed in accordance with examples and techniques as disclosed herein, including one or more aspects described with reference to FIGS. 1 through 3 and 6.

At 820, the method may include forming a second memory array associated with the first level, the second memory array including a second subset of the memory cells and a plurality of second digit lines each operable to couple with the column decoder via a respective second transistor (e.g., a transistor 380) of the first level. The operations of 820 may be performed in accordance with examples and techniques as disclosed herein, including one or more aspects described with reference to FIGS. 1 through 3 and 6.

At 825, the method may include forming a third memory array associated with a second level above the substrate of the memory die, the third memory array including a third subset of the memory cells and a plurality of third digit lines each operable to couple with the column decoder via a respective third transistor (e.g., a transistor 380) of the second level. The operations of 825 may be performed in accordance with examples and techniques as disclosed herein, including one or more aspects described with reference to FIGS. 1 through 3 and 6.

At 830, the method may include forming a fourth memory array associated with the second level, the fourth memory array including a fourth subset of the memory cells and a plurality of fourth digit lines each operable to couple with the column decoder via a respective fourth transistor (e.g., a transistor 380) of the second level. The operations of 830 may be performed in accordance with examples and techniques as disclosed herein, including one or more aspects described with reference to FIGS. 1 through 3 and 6.

In some examples, an apparatus as described herein may perform a method or methods, such as the method 800. The apparatus may include, features, circuitry, logic, means, or instructions (e.g., a non-transitory computer-readable medium storing instructions executable by a processor) for forming a sense component operable for sensing memory cells of a memory die, forming a column decoder of the memory die operable to couple with the sense component, forming a first memory array associated with a first level above a substrate of the memory die, the first memory array including a first subset of the memory cells and a plurality of first digit lines each operable to couple with the column decoder via a respective first transistor of the first level, forming a second memory array associated with the first level, the second memory array including a second subset of the memory cells and a plurality of second digit lines each operable to couple with the column decoder via a respective second transistor of the first level, forming a third memory array associated with a second level above the substrate of the memory die, the third memory array including a third subset of the memory cells and a plurality of third digit lines each operable to couple with the column decoder via a respective third transistor of the second level, and forming a fourth memory array associated with the second level, the fourth memory array including a fourth subset of the memory cells and a plurality of fourth digit lines each operable to couple with the column decoder via a respective fourth transistor of the second level.

Some examples of the method 800 and the apparatus described herein may further include operations, features, circuitry, logic, means, or instructions for forming a plurality of conductors (e.g., associated with intermediate lines 365) each coupled with one of the first transistors of the first level, one of the second transistors of the first level, one of the third transistors of the second level, one of the fourth transistors of the second level, and the column decoder.

In some examples of the method 800 and the apparatus described herein, forming each conductor the plurality of conductors may include operations, features, circuitry, logic, means, or instructions for forming a first conductor portion located in the first level between the first memory array and the second memory array and forming a second conductor portion located in the second level between the third memory array and the fourth memory array.

Some examples of the method 800 and the apparatus described herein may further include operations, features, circuitry, logic, means, or instructions for forming channel portions of each of the first transistors based at least in part on depositing a polycrystalline semiconductor over the substrate in the first level, forming channel portions of each of the second transistors based at least in part on depositing the polycrystalline semiconductor over the substrate in the first level, forming channel portions of each of the third transistors based at least in part on depositing the polycrystalline semiconductor over the substrate in the second level, and forming channel portions of each of the fourth transistors based at least in part on depositing the polycrystalline semiconductor over the substrate in the second level.

Some examples of the method 800 and the apparatus described herein may further include operations, features, circuitry, logic, means, or instructions for forming a plurality of transistors of the column decoder, where forming the plurality of transistors of the column decoder includes forming respective channel portions for each of the plurality of transistors of the column decoder based at least in part on doping respective portions of the substrate.

Figure 9:
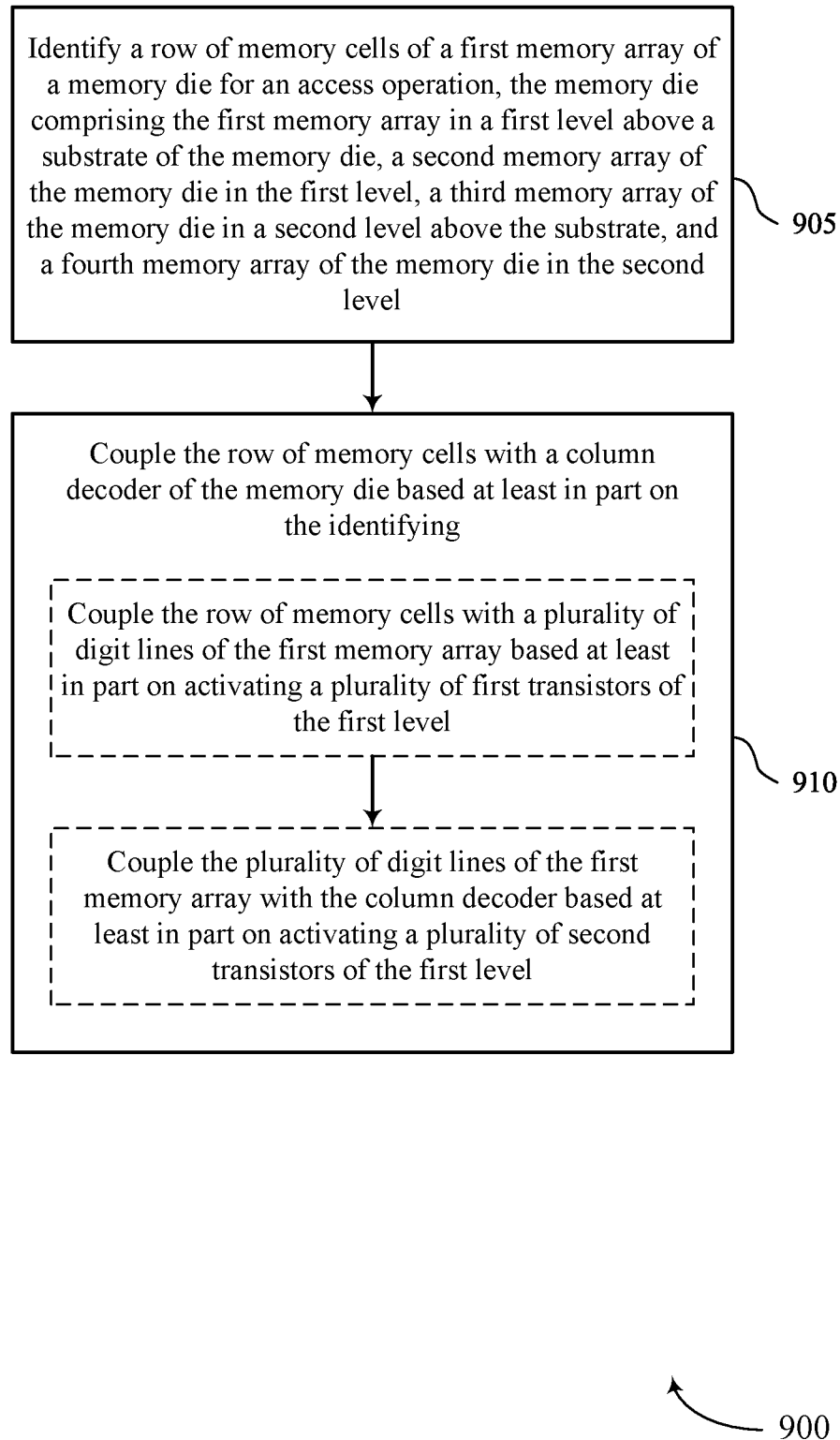

FIG. 9 shows a flowchart illustrating a method 900 that supports thin film transistor deck selection in a memory device in accordance with examples as disclosed herein. The operations of method 900 may be implemented by memory device 100 or its components as described herein. For example, the operations of method 900 may be performed by a deck decoder 370, a column decoder 360, or a row component 125, or various combinations thereof, as described with reference to FIGS. 1 through 3 and 6. In some examples, a memory device 100 may execute a set of instructions to control the functional elements of the device to perform the described functions. Additionally or alternatively, the memory device 100 may perform aspects of the described functions using special-purpose hardware.

At 905, the method may include identifying a row of memory cells of a first memory array of a memory die for an access operation, the memory die including the first memory array in a first level above a substrate of the memory die, a second memory array of the memory die in the first level, a third memory array of the memory die in a second level above the substrate, and a fourth memory array of the memory die in the second level. The operations of 905 may be performed in accordance with examples and techniques as disclosed herein, including one or more aspects described with reference to FIGS. 1 through 3 and 6. In some examples, the operations of 905 may be performed by a memory controller 170, or a row component 125, or a combination thereof.

At 910, the method may include coupling the row of memory cells with a column decoder of the memory die based at least in part on the identifying. In some examples, coupling the row of memory cells with the column decoder may include coupling the row of memory cells with a plurality of digit lines of the first memory array based at least in part on activating a plurality of first transistors (e.g., cell selection components 330) of the first level and coupling the plurality of digit lines of the first memory array with the column decoder based at least in part on activating a plurality of second transistors (e.g., transistors 380) of the first level. The operations of 910 may be performed in accordance with examples and techniques as disclosed herein, including one or more aspects described with reference to FIGS. 1 through 3 and 6. In some examples, the access operation may be performed after the operations of 910, which may include performing a read operation on one or more memory cells of the identified row, or performing a write operation on one or more memory cells of the identified row, or another access operation or combination of access operations.

In some examples, an apparatus as described herein may perform a method or methods, such as the method 900. The apparatus may include, features, circuitry, logic, means, or instructions (e.g., a non-transitory computer-readable medium storing instructions executable by a processor) for identifying a row of memory cells of a first memory array of a memory die for an access operation, the memory die including the first memory array in a first level above a substrate of the memory die, a second memory array of the memory die in the first level, a third memory array of the memory die in a second level above the substrate, and a fourth memory array of the memory die in the second level and coupling the row of memory cells with a column decoder of the memory die based at least in part on the identifying, where coupling the row of memory cells with the column decoder includes coupling the row of memory cells with a plurality of digit lines of the first memory array based at least in part on activating a plurality of first transistors (e.g., cell selection components 330) of the first level and coupling the plurality of digit lines of the first memory array with the column decoder based at least in part on activating a plurality of second transistors (e.g., transistors 380) of the first level.

Some examples of the method 900 and the apparatus described herein may further include operations, features, circuitry, logic, means, or instructions for isolating a second row of memory cells of the second memory array from the column decoder based at least in part on the identifying, where the isolating the second row of memory cells from the column decoder includes coupling the second row of memory cells with a plurality of digit lines of the second memory array based at least in part on activating a plurality of third transistors (e.g., cell selection components 330) of the first level and isolating the plurality of digit lines of the second memory array from the column decoder based at least in part on deactivating a plurality of fourth transistors (e.g., transistors 380) of the first level.

Some examples of the method 900 and the apparatus described herein may further include operations, features, circuitry, logic, means, or instructions for isolating a third row of memory cells of the third memory array from the column decoder based at least in part on the identifying, where the isolating the third row of memory cells from the column decoder includes coupling the third row of memory cells with a plurality of digit lines of the third memory array based at least in part on activating a plurality of fifth transistors (e.g., cell selection components 330) of the second level and isolating the plurality of digit lines of the third memory array from the column decoder based at least in part on deactivating a plurality of sixth transistors (e.g., transistors 380) of the first level.

Some examples of the method 900 and the apparatus described herein may further include operations, features, circuitry, logic, means, or instructions for isolating a fourth row of memory cells of the fourth memory array from the column decoder based at least in part on the identifying, where the isolating the fourth row of memory cells from the column decoder includes coupling the fourth row of memory cells with a plurality of digit lines of the fourth memory array based at least in part on activating a plurality of seventh transistors (e.g., cell selection components 330) of the second level and isolating the plurality of digit lines of the fourth memory array from the column decoder based at least in part on deactivating a plurality of eighth transistors (e.g., transistors 380) of the second level.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a sense component operable for sensing memory cells of a memory die, a column decoder of the memory die operable to couple with the sense component, a first memory array associated with a first level above a substrate of the memory die, the first memory array including a first subset of the memory cells and a plurality of first digit lines each operable to couple with the column decoder via a respective first transistor (e.g., a transistor 380) of the first level, a second memory array associated with the first level, the second memory array including a second subset of the memory cells and a plurality of second digit lines each operable to couple with the column decoder via a respective second transistor (e.g., a transistor 380) of the first level, a third memory array associated with a second level above the substrate of the memory die, the third memory array including a third subset of the memory cells and a plurality of third digit lines each operable to couple with the column decoder via a respective third transistor (e.g., a transistor 380) of the second level, and a fourth memory array associated with the second level, the fourth memory array including a fourth subset of the memory cells and a plurality of fourth digit lines each operable to couple with the column decoder via a respective fourth transistor (e.g., a transistor 380) of the second level.

In some examples, the apparatus may include a plurality of conductors (e.g., of a plurality of intermediate lines 365) each coupled with one of the first transistors of the first level, one of the second transistors of the first level, one of the third transistors of the second level, one of the fourth transistors of the second level, and the column decoder.

In some examples of the apparatus, each conductor of the plurality of conductors includes a respective first portion located in the first level between the first memory array and the second memory array and a respective second portion located in the second level between the third memory array and the fourth memory array.

In some examples of the apparatus, each of the first transistors includes a respective channel portion of the first level, each of the second transistors includes a respective channel portion of the first level, each of the third transistors includes a respective channel portion of the second level, and each of the fourth transistors includes a respective channel portion of the second level.

In some examples, the apparatus may include one or more first gate conductors (e.g., one or more deck selection conductors 480) of the first level each operable to modulate a conductivity of the channel portion of each of the first transistors, one or more second gate conductors (e.g., one or more deck selection conductors 480) of the first level each operable to modulate a conductivity of the channel portion of each of the second transistors, one or more third gate conductors (e.g., one or more deck selection conductors 480) of the second level each operable to modulate a conductivity of the channel portion of each of the third transistors, and one or more fourth gate conductors (e.g., one or more deck selection conductors 480) of the second level each operable to modulate a conductivity of the channel portion of each of the fourth transistors.

In some examples of the apparatus, the channel portion of each of the first transistors includes a respective set of one or more first semiconductor pillars (e.g., pillars 470) in contact with the respective first digit line of the plurality of first digit lines, the channel portion of each of the second transistors includes a respective set of one or more second semiconductor pillars (e.g., pillars 470) in contact with the respective second digit line of the plurality of second digit lines, the channel portion of each of the third transistors includes a respective set of one or more third semiconductor pillars (e.g., pillars 470) in contact with the respective third digit line of the plurality of third digit lines, and the channel portion of each of the fourth transistors includes a respective set of one or more fourth semiconductor pillars (e.g., pillars 470) in contact with the respective fourth digit line of the plurality of fourth digit lines.

In some examples of the apparatus, each memory cell of the first subset of the memory cells may be associated with a respective fifth transistor (e.g., a cell selection component 330) operable to couple the memory cell with a digit line of the plurality of first digit lines, each of the fifth transistors including a respective channel portion including a respective set of one or more fifth semiconductor pillars (e.g., one or more pillars 430), each memory cell of the second subset of the memory cells may be associated with a respective sixth transistor (e.g., a cell selection component 330) operable to couple the memory cell with a digit line of the plurality of second digit lines, each of the sixth transistors including a respective channel portion including a respective set of one or more sixth semiconductor pillars (e.g., one or more pillars 430), each memory cell of the third subset of the memory cells may be associated with a respective seventh transistor (e.g., a cell selection component 330) operable to couple the memory cell with a digit line of the plurality of third digit lines, each of the seventh transistors including a respective channel portion including a respective set of one or more seventh semiconductor pillars (e.g., one or more pillars 430), and each memory cell of the fourth subset of the memory cells may be associated with a respective eighth transistor (e.g., a cell selection component 330) operable to couple the memory cell with a digit line of the plurality of fourth digit lines, each of the eighth transistors including a respective channel portion including a respective set of one or more eighth semiconductor pillars (e.g., one or more pillars 430).

In some examples of the apparatus, the one or more first semiconductor pillars, the one or more second semiconductor pillars, the one or more fifth semiconductor pillars, and the one or more sixth semiconductor pillars may be overlapping along a height dimension (e.g., along a z-direction) relative to the substrate and the one or more third semiconductor pillars, the one or more fourth semiconductor pillars, the one or more seventh semiconductor pillars, and the one or more eighth semiconductor pillars may be overlapping along the height dimension relative to the substrate.

In some examples, the apparatus may include a plurality of fifth transistors (e.g., cell selection components 330) of the first level each operable to couple a respective memory cell of the first subset of the memory cells with a digit line of the plurality of first digit lines, a plurality of sixth transistors (e.g., cell selection components 330) of the first level each operable to couple a respective memory cell of the second subset of the memory cells with a digit line of the plurality of second digit lines, a plurality of seventh transistors (e.g., cell selection components 330) of the second level each operable to couple a respective memory cell of the third subset of the memory cells with a digit line of the plurality of third digit lines, and a plurality of eighth transistors (e.g., cell selection components 330) of the second level each operable to couple a respective memory cell of the fourth subset of the memory cells with a digit line of the plurality of fourth digit lines.

In some examples, the apparatus may include a plurality of word line conductors (e.g., word line conductors 440) each operable to activate a respective row of the plurality of fifth transistors, to activate a respective row of the plurality of sixth transistors, to activate a respective row of the plurality of seventh transistors and to activate a respective row of the plurality of eighth transistors.

In some examples of the apparatus, the column decoder and the sense component each include transistors formed at least in part by a doped portion of the substrate.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a sense component operable for sensing memory cells of a memory die;
   a column decoder of the memory die operable to couple with the sense component;
   a first memory array associated with a first level above a substrate of the memory die, the first memory array comprising a first subset of the memory cells and a plurality of first digit lines each operable to couple with the column decoder via a respective first transistor of a plurality of first transistors of the first level;
   a second memory array associated with the first level, the second memory array comprising a second subset of the memory cells and a plurality of second digit lines each operable to couple with the column decoder via a respective second transistor of a plurality of second transistors of the first level;
   a third memory array associated with a second level above the substrate of the memory die, the third memory array comprising a third subset of the memory cells and a plurality of third digit lines each operable to couple with the column decoder via a respective third transistor of a plurality of third transistors of the second level; and
   a fourth memory array associated with the second level, the fourth memory array comprising a fourth subset of the memory cells and a plurality of fourth digit lines each operable to couple with the column decoder via a respective fourth transistor of a plurality of fourth transistors of the second level.

2. The apparatus of claim 1, further comprising:
   a plurality of conductors each coupled with a respective first transistor of the plurality of first transistors of the first level, a respective second transistor of the plurality of second transistors of the first level, a respective third transistor of the plurality of third transistors of the second level, a respective fourth transistor of the plurality of fourth transistors of the second level, and the column decoder.

3. The apparatus of claim 2, wherein each conductor of the plurality of conductors comprises:
   a respective first portion located in the first level between the first memory array and the second memory array; and
   a respective second portion located in the second level between the third memory array and the fourth memory array.

4. The apparatus of claim 1, wherein:
each of the plurality of first transistors comprises a respective first channel portion of the first level;
each of the plurality of second transistors comprises a respective second channel portion of the first level;
each of the plurality of third transistors comprises a respective third channel portion of the second level; and
each of the plurality of fourth transistors comprises a respective fourth channel portion of the second level.

5. The apparatus of claim 4, further comprising:
one or more first gate conductors of the first level each operable to modulate a conductivity of the respective first channel portion of each of the plurality of first transistors;
one or more second gate conductors of the first level each operable to modulate a conductivity of the respective second channel portion of each of the plurality of second transistors;
one or more third gate conductors of the second level each operable to modulate a conductivity of the respective third channel portion of each of the plurality of third transistors; and
one or more fourth gate conductors of the second level each operable to modulate a conductivity of the respective fourth channel portion of each of the plurality of fourth transistors.

6. The apparatus of claim 4, wherein:
the respective first channel portion of each of the plurality of first transistors comprises a respective set of one or more first semiconductor pillars in contact with a respective first digit line of the plurality of first digit lines;
the respective second channel portion of each of the plurality of second transistors comprises a respective set of one or more second semiconductor pillars in contact with a respective second digit line of the plurality of second digit lines;
the respective third channel portion of each of the plurality of third transistors comprises a respective set of one or more third semiconductor pillars in contact with respective third digit line of the plurality of third digit lines; and
the respective fourth channel portion of each of the plurality of fourth transistors comprises a respective set of one or more fourth semiconductor pillars in contact with a respective fourth digit line of the plurality of fourth digit lines.

7. The apparatus of claim 6, wherein:
each memory cell of the first subset of the memory cells is associated with a respective fifth transistor of a plurality of fifth transistors operable to couple the memory cell with a digit line of the plurality of first digit lines, each of the plurality of fifth transistors comprising a respective fifth channel portion comprising a respective set of one or more fifth semiconductor pillars;
each memory cell of the second subset of the memory cells is associated with a respective sixth transistor of a plurality of sixth transistors operable to couple the memory cell with a digit line of the plurality of second digit lines, each of the plurality of sixth transistors comprising a respective sixth channel portion comprising a respective set of one or more sixth semiconductor pillars;
each memory cell of the third subset of the memory cells is associated with a respective seventh transistor of a plurality of seventh transistors operable to couple the memory cell with a digit line of the plurality of third digit lines, each of the plurality of seventh transistors comprising a respective seventh channel portion comprising a respective set of one or more seventh semiconductor pillars; and
each memory cell of the fourth subset of the memory cells is associated with a respective eighth transistor of a plurality of eighth transistors operable to couple the memory cell with a digit line of the plurality of fourth digit lines, each of the plurality of eighth transistors comprising a respective eighth channel portion comprising a respective set of one or more eighth semiconductor pillars.

8. The apparatus of claim 7, wherein:
the one or more first semiconductor pillars, the one or more second semiconductor pillars, the one or more fifth semiconductor pillars, and the one or more sixth semiconductor pillars are overlapping along a height dimension relative to the substrate, and
the one or more third semiconductor pillars, the one or more fourth semiconductor pillars, the one or more seventh semiconductor pillars, and the one or more eighth semiconductor pillars are overlapping along the height dimension relative to the substrate.

9. The apparatus of claim 1, further comprising:
a plurality of fifth transistors of the first level each operable to couple a respective memory cell of the first subset of the memory cells with a digit line of the plurality of first digit lines;
a plurality of sixth transistors of the first level each operable to couple a respective memory cell of the second subset of the memory cells with a digit line of the plurality of second digit lines;
a plurality of seventh transistors of the second level each operable to couple a respective memory cell of the third subset of the memory cells with a digit line of the plurality of third digit lines; and
a plurality of eighth transistors of the second level each operable to couple a respective memory cell of the fourth subset of the memory cells with a digit line of the plurality of fourth digit lines.

10. The apparatus of claim 9, further comprising:
a plurality of word line conductors each operable to activate a respective row of the plurality of fifth transistors, to activate a respective row of the plurality of sixth transistors, to activate a respective row of the plurality of seventh transistors and to activate a respective row of the plurality of eighth transistors.

11. The apparatus of claim 1, wherein the column decoder and the sense component each comprise transistors formed at least in part by a doped portion of the substrate.

12. A method, comprising:
forming a sense component operable for sensing memory cells of a memory die;
forming a column decoder of the memory die operable to couple with the sense component;
forming a first memory array associated with a first level above a substrate of the memory die, the first memory array comprising a first subset of the memory cells and a plurality of first digit lines each operable to couple with the column decoder via a respective first transistor of a plurality of first transistors of the first level;
forming a second memory array associated with the first level, the second memory array comprising a second subset of the memory cells and a plurality of second digit lines each operable to couple with the column decoder via a respective second transistor of a plurality of second transistors of the first level;

forming a third memory array associated with a second level above the substrate of the memory die, the third memory array comprising a third subset of the memory cells and a plurality of third digit lines each operable to couple with the column decoder via a respective third transistor of a plurality of third transistors of the second level; and forming a fourth memory array associated with the second level, the fourth memory array comprising a fourth subset of the memory cells and a plurality of fourth digit lines each operable to couple with the column decoder via a respective fourth transistor of a plurality of fourth transistors of the second level.

13. The method of claim 12, further comprising:

forming a plurality of conductors each coupled with a respective first transistor of the plurality of first transistors of the first level, a respective second transistor of the plurality of second transistors of the first level, a respective third transistor of the plurality of third transistors of the second level, a respective fourth transistor of the plurality of fourth transistors of the second level, and the column decoder.

14. The method of claim 13, wherein forming each conductor of the plurality of conductors comprises:

forming a first conductor portion located in the first level between the first memory array and the second memory array; and forming a second conductor portion located in the second level between the third memory array and the fourth memory array.

15. The method of claim 12, further comprising:

forming respective first channel portions of each of the plurality of first transistors based at least in part on depositing a polycrystalline semiconductor over the substrate in the first level;

forming respective second channel portions of each of the plurality of second transistors based at least in part on depositing the polycrystalline semiconductor over the substrate in the first level;

forming respective third channel portions of each of the plurality of third transistors based at least in part on depositing the polycrystalline semiconductor over the substrate in the second level; and forming respective fourth channel portions of each of the plurality of fourth transistors based at least in part on depositing the polycrystalline semiconductor over the substrate in the second level.

16. The method of claim 12, further comprising:

forming a plurality of transistors of the column decoder, wherein forming the plurality of transistors of the column decoder comprises forming respective channel portions for each of the plurality of transistors of the column decoder based at least in part on doping respective portions of the substrate.

17. A method, comprising:

identifying a row of memory cells of a first memory array of a memory die for an access operation, the memory die comprising the first memory array in a first level above a substrate of the memory die, a second memory array of the memory die in the first level, a third memory array of the memory die in a second level above the substrate, and a fourth memory array of the memory die in the second level; and coupling the row of memory cells with a column decoder of the memory die based at least in part on the identifying, wherein coupling the row of memory cells with the column decoder comprises:

coupling the row of memory cells with a plurality of digit lines of the first memory array based at least in part on activating a plurality of first transistors of the first level; and coupling the plurality of digit lines of the first memory array with the column decoder based at least in part on activating a plurality of second transistors of the first level.

18. The method of claim 17, further comprising:

isolating a second row of memory cells of the second memory array from the column decoder based at least in part on the identifying, wherein the isolating the second row of memory cells from the column decoder comprises:

coupling the second row of memory cells with a plurality of digit lines of the second memory array based at least in part on activating a plurality of third transistors of the first level; and isolating the plurality of digit lines of the second memory array from the column decoder based at least in part on deactivating a plurality of fourth transistors of the first level.

19. The method of claim 17, further comprising:

isolating a third row of memory cells of the third memory array from the column decoder based at least in part on the identifying, wherein the isolating the third row of memory cells from the column decoder comprises:

coupling the third row of memory cells with a plurality of digit lines of the third memory array based at least in part on activating a plurality of fifth transistors of the second level; and isolating the plurality of digit lines of the third memory array from the column decoder based at least in part on deactivating a plurality of sixth transistors of the first level.

20. The method of claim 19, further comprising:

isolating a fourth row of memory cells of the fourth memory array from the column decoder based at least in part on the identifying, wherein the isolating the fourth row of memory cells from the column decoder comprises:

coupling the fourth row of memory cells with a plurality of digit lines of the fourth memory array based at least in part on activating a plurality of seventh transistors of the second level; and isolating the plurality of digit lines of the fourth memory array from the column decoder based at least in part on deactivating a plurality of eighth transistors of the second level.

* * * * *